(12) United States Patent
Kang et al.

(10) Patent No.: US 9,070,748 B2
(45) Date of Patent: Jun. 30, 2015

(54) SEMICONDUCTOR DEVICES HAVING THROUGH-VIAS AND METHODS FOR FABRICATING THE SAME

(71) Applicant: Samsung Electronics Co., Ltd., Suwon-si (KR)

(72) Inventors: Pil-Kyu Kang, Anyang-si (KR); Taeyeong Kim, Suwon-si (KR); Byung Lyul Park, Seoul (KR); Jumyong Park, Yongin-si (KR); Jinho Park, Yongin-si (KR); Kyu-Ha Lee, Yongin-si (KR); Deok-Young Jung, Seoul (KR); Gilheyun Choi, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/108,771

(22) Filed: Dec. 17, 2013

(65) Prior Publication Data

US 2014/0179103 A1    Jun. 26, 2014

(30) Foreign Application Priority Data

Dec. 20, 2012    (KR) .................. 10-2012-0149598

(51) Int. Cl.
*H01L 21/768*    (2006.01)

(52) U.S. Cl.
CPC ...... *H01L 21/7684* (2013.01); *H01L 21/76877* (2013.01); *H01L 2924/0002* (2013.01); *H01L 2224/13* (2013.01); *H01L 2224/16145* (2013.01); *H01L 2924/15311* (2013.01)

(58) Field of Classification Search
CPC ...................... H01L 21/7684; H01L 21/76877

USPC .................................................. 438/667, 401
See application file for complete search history.

(56) References Cited

U.S. PATENT DOCUMENTS

| | | | |
|---|---|---|---|
| 7,821,107 | B2 | 10/2010 | Pratt |
| 7,863,721 | B2 | 1/2011 | Suthiwongsunthorn et al. |
| 7,928,534 | B2 | 4/2011 | Hsu et al. |
| 7,956,442 | B2 | 6/2011 | Hsu et al. |
| 8,017,497 | B2 | 9/2011 | Oi |
| 8,039,386 | B1 | 10/2011 | Dao et al. |
| 2009/0283871 | A1 | 11/2009 | Chang et al. |
| 2010/0090304 | A1 | 4/2010 | Liu et al. |
| 2010/0117201 | A1 | 5/2010 | Ching et al. |

(Continued)

FOREIGN PATENT DOCUMENTS

| | | |
|---|---|---|
| JP | 2008135671 | 6/2008 |
| KR | 2007063812 | 6/2007 |

(Continued)

*Primary Examiner* — Christine Enad
(74) *Attorney, Agent, or Firm* — Onello & Mello, LLP

(57) ABSTRACT

A conductive via of a semiconductor device is provided extending in a vertical direction through a substrate, a first end of the conductive via extending through a first surface of the substrate, so that the first end protrudes in the vertical direction relative to the first surface of the substrate. An insulating layer is provided on the first end of the conductive via and on the first surface of the substrate. An upper portion of a mask layer pattern is removed so that a capping portion of the insulating layer that is on the first end of the conductive via is exposed. A portion of the insulating layer at a side of, and spaced apart from, the conductive via, is removed, to form a recess in the insulating layer. The capping portion of the insulating layer on the first end of the conductive via is simultaneously removed.

14 Claims, 31 Drawing Sheets

(56) References Cited

U.S. PATENT DOCUMENTS

| | | |
|---|---|---|
| 2010/0159699 A1 | 6/2010 | Takahashi |
| 2010/0164109 A1 | 7/2010 | Chiou et al. |
| 2010/0224876 A1 | 9/2010 | Zhu |
| 2010/0314758 A1 | 12/2010 | Wu et al. |
| 2011/0031633 A1 | 2/2011 | Hsu et al. |
| 2011/0068466 A1* | 3/2011 | Chen et al. ............... 257/737 |
| 2011/0108986 A1 | 5/2011 | Lin et al. |
| 2011/0165776 A1 | 7/2011 | Hsu et al. |
| 2011/0217841 A1 | 9/2011 | Chen et al. |
| 2011/0227186 A1 | 9/2011 | Chang et al. |
| 2011/0241217 A1* | 10/2011 | Chang et al. ............. 257/774 |
| 2011/0300710 A1 | 12/2011 | Henry et al. |
| 2012/0001337 A1 | 1/2012 | Tsai et al. |
| 2012/0056315 A1 | 3/2012 | Chang et al. |
| 2013/0200525 A1* | 8/2013 | LEE et al. ............... 257/774 |
| 2013/0264720 A1* | 10/2013 | Chun et al. ............. 257/774 |

FOREIGN PATENT DOCUMENTS

| | | |
|---|---|---|
| KR | 1014839 | 2/2011 |
| KR | 2011075390 | 7/2011 |
| KR | 2011136122 | 12/2011 |

* cited by examiner

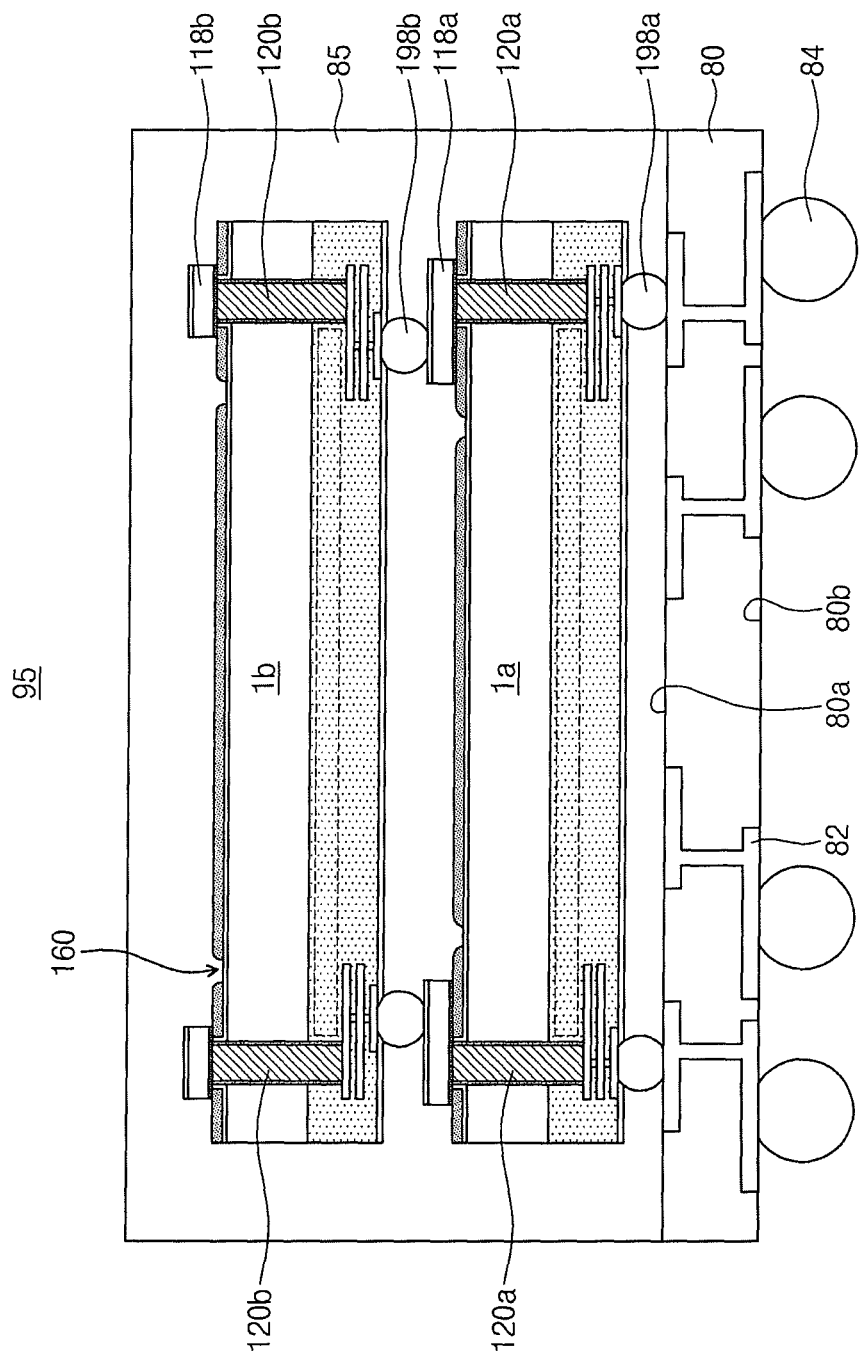

SEMICONDUCTOR DEVICES HAVING THROUGH-VIAS AND METHODS FOR FABRICATING THE SAME

CROSS-REFERENCE TO RELATED APPLICATIONS

This U.S. nonprovisional patent application claims priority under 35 U.S.C. §119 of Korean Patent Application 10-2012-0149578 filed Dec. 20, 2012, the entire contents of which are hereby incorporated by reference.

BACKGROUND

The present inventive concepts relate to semiconductor devices and, more particularly, to semiconductor devices having through-vias and methods for fabricating the same.

Generally, in the fabrication of semiconductor devices having through-silicon vias, the through-vias may be configured to protrude in an outward direction from a non-active surface of a substrate. An insulation layer is then deposited on the non-active surface, and the deposited insulation layer may then be polished so that the through-vias become exposed through the polished insulation layer. A protrusion section may be present on the through-via because the insulation layer is deposited on the protruded through-via. If protruded length of the protrusion section over the through-vias is large, the through-via may be fractured or otherwise damaged during the polishing process. As a result, yield of fabrication of the semiconductor device may drop and reliability of the resulting devices may possibly suffer.

SUMMARY

Embodiments of the inventive concepts provide semiconductor devices having through-vias capable of reducing the protrusion length over the through-via and having improved yield and methods for fabricating the same.

Other embodiments of the inventive concepts provide semiconductor devices having through-vias capable of preventing damage of the through-via and methods for fabricating the same.

Still other embodiments of the inventive concepts provide semiconductor devices having through-vias capable of reducing contamination of the through-via and methods for fabricating the same.

In an aspect, a method of forming a semiconductor device, comprises: providing a conductive via extending in a vertical direction through a substrate, a first end of the conductive via extending through a first surface of the substrate, so that the first end protrudes in the vertical direction relative to the first surface of the substrate; providing an insulating layer on the first end of the conductive via and on the first surface of the substrate; providing a mask layer on the insulating layer, and patterning the mask layer to form a mask layer pattern, the mask layer pattern having an opening at a side of the conductive via; removing an upper portion of the mask layer pattern so that a capping portion of the insulating layer that is on the first end of the conductive via is exposed; and removing a portion of the insulating layer at a side of, and spaced apart from, the conductive via, using the mask layer pattern as an etch mask, to form a recess in the insulating layer, and simultaneously removing the capping portion of the insulating layer on the first end of the conductive via.

In some embodiments, the recess comprises an alignment key of the semiconductor device.

In some embodiments, the method further comprises following removing the portion of the insulating layer at a side of, and spaced apart from, the conductive via, using the mask layer pattern as an etch mask, to form a recess in the insulating layer, and simultaneously removing the capping portion of the insulating layer: planarizing the first end of the conductive via.

In some embodiments, planarizing the first end of the conductive via further results in upper corner portions of the alignment key opening in the insulating layer have a rounded cross-sectional profile.

The method of claim 1b further comprising applying a conductive pad to the planarized first end of the conductive via.

In some embodiments, the method further comprises, prior to removing the portion of the insulating layer at a side of, and spaced apart from, the conductive via, using the mask layer pattern as an etch mask, and simultaneously removing the capping portion of the insulating layer: removing at least an upper portion of the mask layer pattern.

In some embodiments, the method further comprises, following removing the portion of the insulating layer at a side of, and spaced apart from, the conductive via, using the mask layer pattern as an etch mask, and simultaneously removing the capping portion of the insulating layer: removing the mask layer pattern.

In some embodiments, forming the insulating layer comprises: forming a lower insulating layer on the first end of the conductive via and on the first surface of the substrate; and forming an upper insulating layer on the lower insulating layer, the upper insulating layer having etch selectivity with respect to the lower insulating layer; wherein removing a portion of the insulating layer comprises removing at least a portion of the upper insulating layer to form the recess in the upper insulating layer.

In some embodiments, removing a portion of the insulating layer further comprises removing at least a portion of the lower insulating layer to further form the recess in the lower insulating layer.

In some embodiments, providing a mask layer on the insulating layer comprises providing a first portion of the mask layer to a first depth on first surface of the substrate and providing a second portion of the mask layer to a second depth on the first end of the conductive via and wherein the first depth is greater than the second depth.

In some embodiments, providing the mask layer comprises providing the mask layer to include an upper surface that is substantially planar In some embodiments, the first portion of the mask layer has an upper surface that is at a first height relative to an upper surface of the substrate and wherein the insulating layer on the first end of the conductive via has an upper surface that is at a second height relative to the upper surface of the substrate, and wherein the first height is less than the second height.

In some embodiments, the first portion of the mask layer has an upper surface that is at a first height relative to an upper surface of the substrate and wherein the capping portion of the insulating layer has an upper surface that is at a second height relative to the upper surface of the substrate, and wherein the first height is greater than the second height.

In some embodiments, the method further comprises further removing an upper portion of that mask layer pattern to form a recessed mask layer pattern, and removing a portion of the insulating layer at a side of, and spaced apart from, the conductive via, using the recessed mask layer pattern as an etch mask.

In some embodiments, patterning the mask layer to form a mask layer pattern comprises: forming a first exposure region that is fully exposed to light energy and a second exposure region that is partially exposed to light energy; forming an opening that exposes a portion of the insulating layer corresponding to the recess by removing the first exposure region; and forming an opening that exposes a portion of the insulating layer corresponding to the capping portion by removing the second exposure region.

In an aspect, a method of forming a semiconductor device, comprises: providing a conductive via extending in a vertical direction through a substrate, a first end of the conductive via extending through a first surface of the substrate, so that the first end projects in a vertical direction relative to the first surface of the substrate; providing an insulating layer on the first end of the conductive via and on the first surface of the substrate; providing a mask layer on the insulating layer, and patterning the mask layer to form a mask layer pattern, the mask layer pattern having an opening at a side of the conductive via; removing an upper portion of the mask layer pattern so that a capping portion of the insulating layer that is on the first end of the conductive via is exposed; and removing a portion of the insulating layer at a side of, and spaced apart from, the conductive via, using the mask layer pattern as an etch mask, to form an alignment key opening in the insulating layer; and following forming the alignment key opening, planarizing the first end of the conductive via.

In some embodiments, removing the portion of the insulating layer at a side of, and spaced apart from, the conductive via, using the mask layer pattern as an etch mask, to form an alignment key opening in the insulating layer, is performed simultaneous with removing the capping portion of the insulating layer on the first end of the conductive via.

In some embodiments, the method further comprises, following removing the portion of the insulating layer at a side of, and spaced apart from, the conductive via, using the mask layer pattern as an etch mask, to form an alignment key opening in the insulating layer, and simultaneously removing the capping portion of the insulating layer: planarizing the first end of the conductive via.

In some embodiments, planarizing the first end of the conductive via further results in upper corner portions of the alignment key opening in the insulating layer have a rounded cross-sectional profile.

In some embodiments, the method further comprises, applying a conductive pad to the planarized first end of the conductive via.

In some embodiments, the method further comprises, prior to removing the portion of the insulating layer at a side of, and spaced apart from, the conductive via, using the mask layer pattern as an etch mask, and simultaneously removing the capping portion of the insulating layer: removing at least an upper portion of the mask layer pattern.

In some embodiments, the method further comprises, following removing the portion of the insulating layer at a side of, and spaced apart from, the conductive via, using the mask layer pattern as an etch mask, and simultaneously removing the capping portion of the insulating layer: removing the mask layer pattern.

In some embodiments, forming the insulating layer comprises: forming a lower insulating layer on the first end of the conductive via and on the first surface of the substrate; and forming an upper insulating layer on the lower insulating layer, the upper insulating layer having etch selectivity with respect to the lower insulating layer; wherein removing a portion of the insulating layer comprises removing at least a portion of the upper insulating layer to form the recess in the upper insulating layer.

In some embodiments, removing a portion of the insulating layer further comprises removing at least a portion of the lower insulating layer to further form the recess in the lower insulating layer.

In some embodiments, providing a mask layer on the insulating layer, comprises providing a first portion of the mask layer to a first depth on first surface of the substrate and providing a second portion of the mask layer to a second depth on the first end of the conductive via and wherein the first depth is greater than the second depth.

In some embodiments, providing the mask layer comprises providing the mask layer to include an upper surface that is substantially planar.

In some embodiments, the first portion of the mask layer has an upper surface that is at a first height relative to an upper surface of the substrate and wherein the insulating layer on the first end of the conductive via has an upper surface that is at a second height relative to the upper surface of the substrate, and wherein the first height is less than the second height.

In some embodiments, the first portion of the mask layer has an upper surface that is at a first height relative to an upper surface of the substrate and wherein the capping portion of the insulating layer has an upper surface that is at a second height relative to the upper surface of the substrate, and wherein the first height is greater than the second height.

In some embodiments, the method further comprises, further removing an upper portion of that mask layer pattern to form a recessed mask layer pattern, and removing a portion of the insulating layer at a side of, and spaced apart from, the conductive via, using the recessed mask layer pattern as an etch mask.

In some embodiments, patterning the mask layer to form a mask layer pattern comprises: forming a first exposure region that is fully exposed to light energy and a second exposure region that is partially exposed to light energy; forming an opening that exposes a portion of the insulating layer corresponding to the recess by removing the first exposure region; and forming an opening that exposes a portion of the insulating layer corresponding to the capping portion by removing the second exposure region.

In an aspect, a semiconductor device comprises: a substrate comprising a first surface and an opposed, second surface, the substrate extending in a horizontal direction of extension; an insulation layer on the first surface of the substrate; a conductive via extending through the substrate in a vertical direction of extension relative to the horizontal direction of extension of the substrate, a first end of the conductive via extending through the first surface of the substrate so that the first end protrudes in the vertical direction relative to the first surface of the substrate; and an alignment key recess in the insulation layer at a side of, and spaced apart from, the conductive via, an outermost edge of the alignment key recess having a rounded cross-sectional profile.

In some embodiments, the semiconductor device further comprises a conductive terminal pad on the first end of the conductive via.

In some embodiments, the insulation layer comprises a lower insulation layer on the first surface of the substrate and an upper insulation layer on the lower insulation layer, wherein the lower insulation layer and the upper insulation layer have different etch selectivities with respect to each other, and wherein the alignment key recess is in the upper insulation layer.

In some embodiments, wherein the alignment key recess comprises a partial recess in the upper insulation layer.

In some embodiments, the alignment key recess comprises a complete recess in the upper insulation layer.

In some embodiments, wherein the alignment key recess comprises a complete recess in the upper insulation layer and a partial recess in the lower insulation layer.

In some embodiments, wherein the lower insulation layer extends from the first surface of the substrate along a sidewall of the conductive via.

In some embodiments, the semiconductor device further comprises a via insulation layer between sidewalls of the conductive via In some embodiments, the semiconductor device comprises first and second stacked semiconductor devices, and wherein the conductive via of the first semiconductor device and the conductive via of the second semiconductor device are connected at a conductive terminal.

In some embodiments, the conductive terminal is aligned between the conductive via of the first semiconductor device and the conductive via of the second semiconductor device.

In some embodiments, the conductive terminal is horizontally offset so that it is not aligned between the conductive via of the first semiconductor device and the conductive via of the second semiconductor device.

In another aspect, a memory system comprises: a memory controller that generates command and address signals; and a memory module comprising a plurality of memory devices, the memory module receiving the command and address signals and in response storing and retrieving data to and from at least one of the memory devices, wherein each memory device comprises: a substrate comprising a first surface and an opposed, second surface, the substrate extending in a horizontal direction of extension; an insulation layer on the first surface of the substrate; a conductive via extending through the substrate in a vertical direction of extension relative to the horizontal direction of extension of the substrate, a first end of the conductive via extending through the first surface of the substrate so that the first end protrudes in the vertical direction relative to the first surface of the substrate; and an alignment key recess in the insulation layer at a side of, and spaced apart from, the conductive via, an outermost edge of the alignment key recess having a rounded cross-sectional profile.

BRIEF DESCRIPTION OF THE DRAWINGS

The foregoing and other features and advantages of example embodiments of inventive concepts will be apparent from the more particular description of non-limiting embodiments of inventive concepts, as illustrated in the accompanying drawings in which like reference characters refer to the same parts throughout the different views. The drawings are not necessarily to scale, emphasis instead being placed upon illustrating the principles of inventive concepts. In the drawings:

FIGS. 4A and 4B are cross-sectional views illustrating semiconductor packages according to some exemplary embodiments of the present inventive concepts.

DETAILED DESCRIPTION

Figure 1:
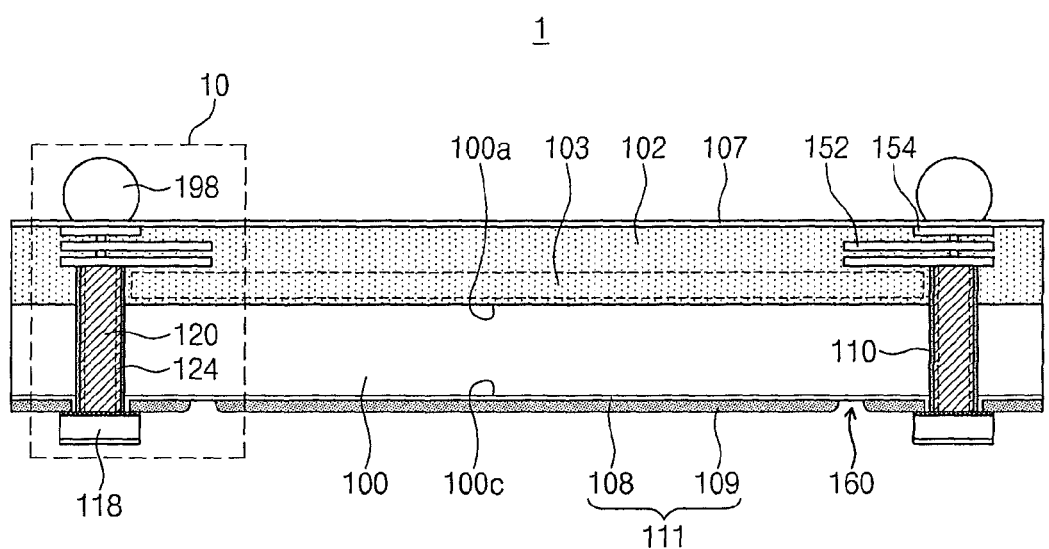
FIG. 1 is a cross-sectional view illustrating a semiconductor device according to some exemplary embodiments of the present inventive concepts.

Example embodiments of inventive concepts will now be described more fully hereinafter with reference to the accompanying drawings, in which some example embodiments of inventive concepts are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of example embodiments of inventive concepts. Aspects of example embodiments of inventive concepts explained and illustrated herein include their complementary counterparts. The same reference numerals or the same reference designators denote the same elements throughout the specification.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating a semiconductor device according to some exemplary embodiments of the present inventive concepts.

Referring to FIG. 1, a semiconductor device 1 may comprise an electrical interconnection part 10 which is configured, or otherwise constructed and arranged to transmit an electrical signal in a vertical direction through a substrate 100. The electrical interconnection part 10 may comprise a through-via 120. In some embodiments, the through-via 120 extends in a substantially vertical direction of extension relative to a horizontal direction of extension of the substrate 100. A via isolation layer 110 may be positioned between the through-via 120 and the substrate 100. With the presence of the via isolation layer 110, the through-via 120 may be electrically isolated from the substrate 100. A barrier layer 124 may be further provided between the through-via 120 and the via isolation layer 110, thereby preventing constituent parts (e.g., copper) of the through-via 120 from being diffused into the substrate 100.

The semiconductor device 1 may further include at least one of an upper terminal 198 and a lower terminal 118 that are electrically connected to the through-via 120. In some embodiments, the upper terminal 198 may be disposed on an active surface 100a of the substrate 100 and the lower terminal 118 may be disposed on a non-active surface 100c of the substrate 100. In some embodiments, the lower terminal 118 may be disposed on an active surface 100a of the substrate 100 and the upper terminal 198 may be disposed on a non-active surface 100c of the substrate 100. In various embodiments, the upper terminal 198 and the lower terminal 118 may include various interconnection configurations, including solder balls, solder bumps, re-interconnections, and/or pads. In some embodiments, the upper terminal 198 may include a solder ball and the lower terminal 118 may include a pad.

In various embodiments, an integrated circuit 103, a metal interconnection 152, and an interlayer insulation layer 102 may optionally be disposed on the active surface 100a of the substrate 100. The metal interconnection 152 may be electrically connected to the integrated circuit 103 and have a single-layered structure or a multi-layered structure. The interlayer insulation layer 102 may be constructed and arranged to cover the integrated circuit 103 and the metal interconnection 152. In some embodiments, an upper insulation layer 107 may be disposed on the interlayer insulation layer 102. The upper insulation layer 107 may have an opening that exposes a bonding pad 154 to which the upper terminal 198 is connected. The metal interconnection 152 may in turn be electrically connected to the through-via 120, such that the integrated circuit 103 is thereby electrically connected to the through-via 120. The through-via 120 may be disposed through the substrate beyond an outer edge of the integrated circuit 103 or within a horizontal boundary of the integrated circuit 103.

In some embodiments, a lower insulation layer 111 having an alignment key 160 may be provided on the non-active surface 100c of the substrate 100. In some embodiments, the alignment key 160 may be formed by patterning the lower insulation layer 111. In some embodiments, the alignment key 160 may be employed for the positional alignment of the lower terminal 118 during its formation. In some embodiments, the alignment key 160 may also optionally be used for alignment during a step when the semiconductor device 1 is stacked on one or more of the same or different semiconductor devices. The alignment key 160 may be disposed within and/or around a region defined by the integrated circuit 103. For example, the alignment key 160 may reside in a region between the through-vias 120 of a common integrated circuit (that is within the integrated circuit region), or, alternatively, in a region outside the through-vias 120 of a common integrated circuit (that is outside the integrated circuit region), or inside and outside the through-via 120 (in both regions). In the present embodiment, the alignment key 160 may comprise rounded corners. This feature is described in further detail herein. The electrical interconnection part 10 may be formed to have various structures as described with reference to FIGS. 2A, 3A and 3B.

Figure 2A:
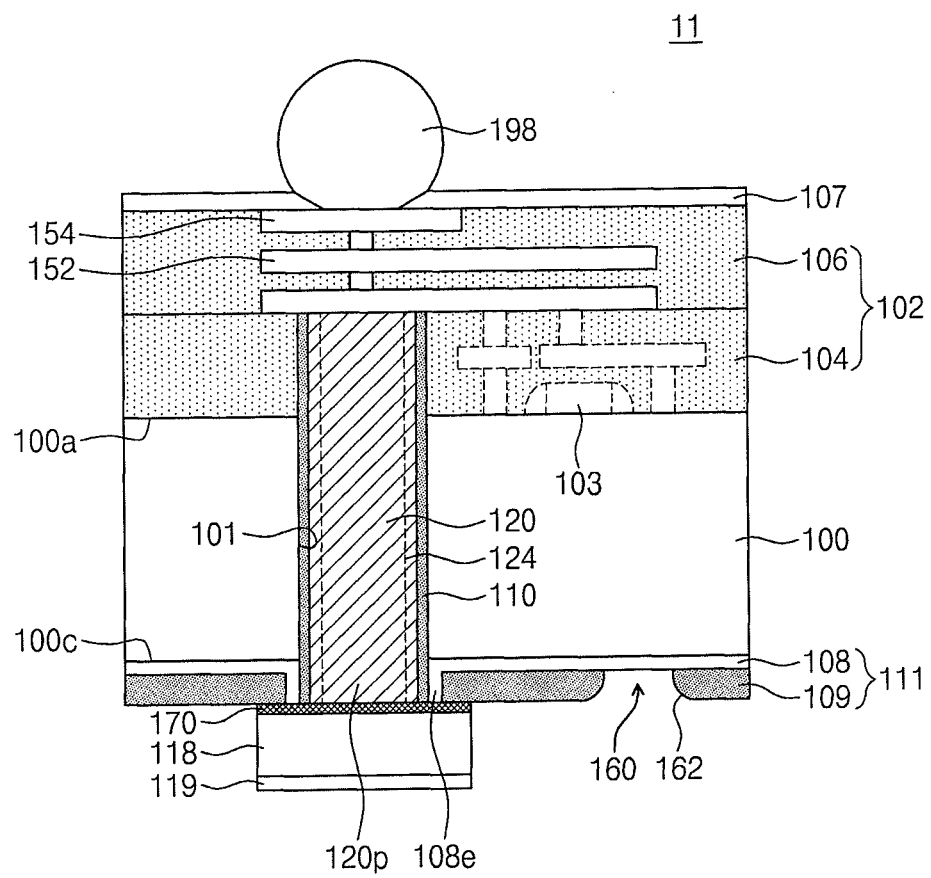
FIG. 2A is a cross-sectional view illustrating an electrical interconnection part according to some exemplary embodiments of the present inventive concepts.
Figure 2B:
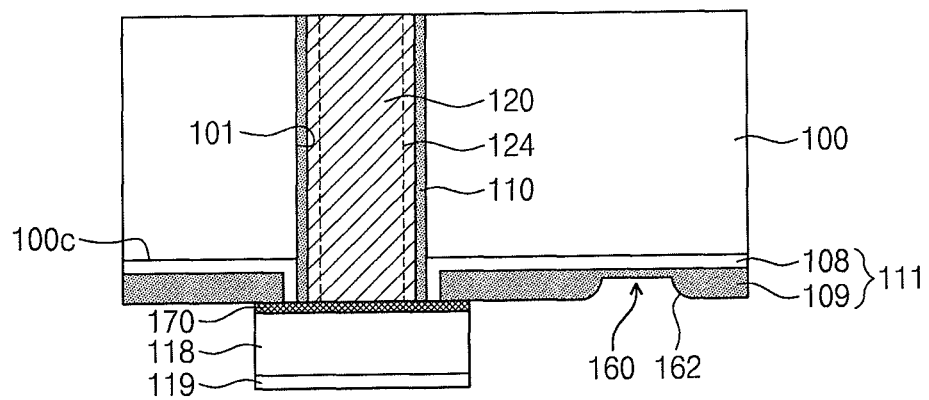
FIGS. 2B and 2C are cross-sectional views illustrating alignment keys according to some exemplary embodiments of the present inventive concepts.
Figure 2C:
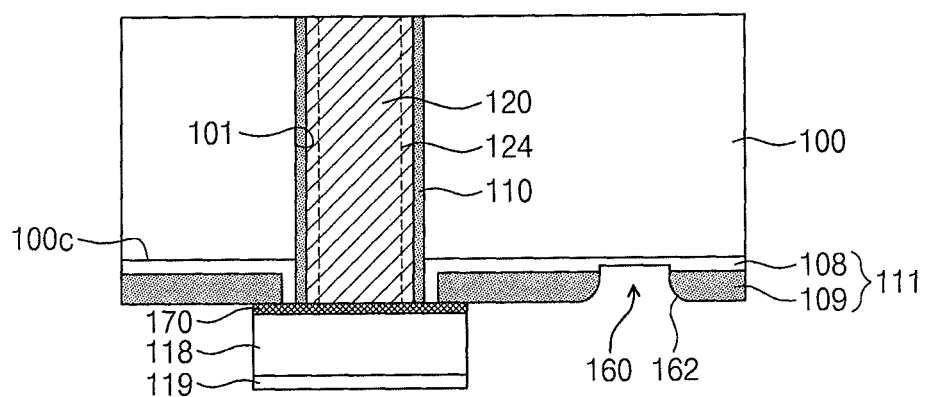
Figure 2D:
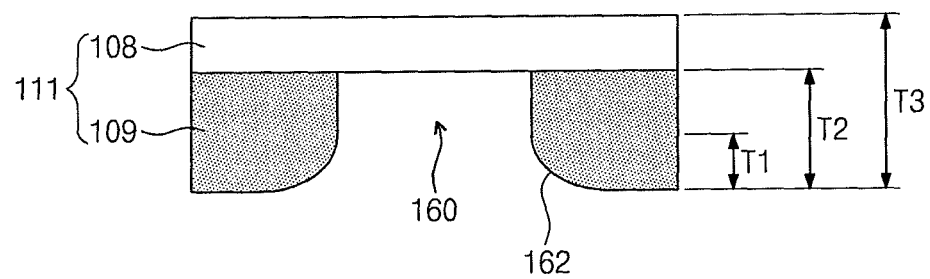
FIG. 2D is a cross-sectional view illustrating various dimensions of an alignment key according to some exemplary embodiments of the present inventive concepts.

FIG. 2A is a cross-sectional view illustrating an electrical interconnection part according to some exemplary embodiments of the present inventive concepts. FIGS. 2B and 2C are cross-sectional views illustrating alignment keys according to some exemplary embodiments of the present inventive concepts. FIG. 2D is a cross-sectional view illustrating various dimensions of an alignment key according to some exemplary embodiments of the present inventive concepts.

Referring to FIG. 2A, an electrical interconnection part 11 may have a via-middle structure including the through-via 120, which through-via may be formed following formation of the integrated circuit 103 and prior to the formation of the metal interconnection 152. The interlayer insulation layer 102 may include a first interlayer insulation layer 104 formed on the active surface 100a of the substrate 100 to cover the integrated circuit 103 and a second interlayer insulation layer 106 positioned on the first interlayer insulation layer 104 to cover the metal interconnection 152 and the bonding pad 154. The through-via 120 may be electrically connected to the lower terminal 118 through the first interlayer insulation layer 104 and the substrate 100. In some embodiments, the through-via 120 may be formed to have a pillar shape. In some embodiments, the through-via 120 may have a bottom end 120p which protrudes outward from the non-active surface 100c of the substrate 100.

In some embodiments, the upper terminal 198 and the lower terminal 118 may be vertically aligned with the through-via 120. Alternatively, in some embodiments, as illustrated in FIG. 4B, the upper terminal 198 may not be vertically aligned with the through-via 120 and/or the lower terminal 118 may be redistributed using the metal interconnection 152. A plating layer 119 may be further provided on the lower terminal 118. The plating layer 119 may comprise Au, Ag, Pt or any combination thereof. An under bump metal layer 170 may be further provided between the through-via 120 and the lower terminal 118.

In some embodiments, the lower insulation layer 111 may have a multi-layered structure including a first lower insulation layer 108 and a second lower insulation layer 109 which are stacked one atop the other. The first lower insulation layer 108 may be provided on the non-active surface 100c of the substrate 100 and the second lower insulation layer 109 may be provided on the first lower insulation layer 108. Alternatively, the lower insulation layer 111 may have a single-layered structure including one of the first and second lower insulation layers 108 and 109. In some embodiments, the first lower insulation layer 108 may cover the non-active surface 100c and a sidewall of the bottom end 120p, thereby having an "L" shape. For example, the first lower insulation layer 108 may have an extension 108e which vertically extends from the non-active surface 100c to cover or surround the sidewall of the bottom end 120p. The via isolation layer 110 may protrude outward from, or beyond, the non-active surface 100c and may be disposed between the bottom end 120p of the through-via 120 and the extension 108e of the first lower insulation layer 108.

In some embodiments, the alignment key 160 may be formed by patterning the second lower insulation layer 109. For example, a portion of the second lower insulation layer 109 may be removed by etching and chemical mechanical polishing processes. The removed portion of the second lower insulation layer 109 may be defined as the alignment key 160. The alignment key 160 may have non-sharp corners 162 that are rounded in cross-section due to the chemical mechanical polishing process. For example, during the chemical mechanical process following the etching process, an etched portion of the second insulation layer 109 may be subjected to locally increased pressure such that the corners 162 of the alignment key 160 may become rounded. The alignment key 160 may partially expose the first lower insulation layer 108. In various embodiments, the alignment key 160 may have a cross-sectional shape that are generally circular, elliptical, oval-shaped, triangular, rectangular, star-shaped, cross-shaped or dash shaped from the perspective of a plan view.

Alternatively, in some embodiments, as illustrated in FIG. 2B, the second lower insulation layer 109 is not etched to a depth so as to expose the first lower insulation layer 108. Accordingly, a portion of the second lower insulation layer 109 may be recessed to define the alignment key 160 in the shape of dent in the second lower insulation layer 109. Alternatively, in some embodiments, as illustrated in FIG. 2C, the first lower insulation layer 108 is over-etched such that the over-etched portion of the first lower insulation layer 108 may therefore become a part of the alignment key 160.

Referring to FIG. 2D, in some embodiments, a first thickness T1 of the corner 162 included in the alignment key 160 may be less than a second thickness T2 of the second lower insulation layer 109. For example, the first thickness T1 may be the same as, or less than, half of the second thickness T2. Alternatively, in some embodiments, the first thickness T1 may be greater than half of the second thickness T2 according to a condition and/or a variation of the chemical mechanical process. Alternatively, the first thickness T1 may be greater or less than a half of a third thickness T3 of the lower insulation layer 111 inclusive of both thicknesses of the first lower insulation layer 108 and the second lower insulation layer 109.

Figure 3A:
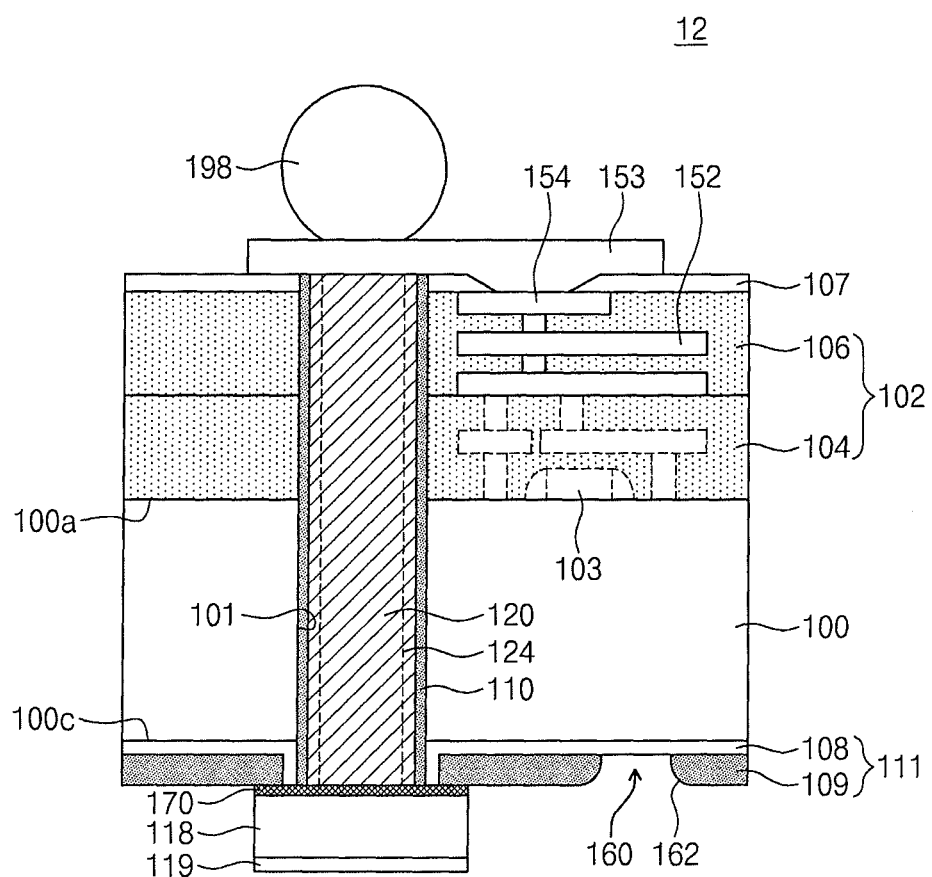
FIGS. 3A and 3B are cross-sectional views illustrating electrical interconnection parts according to some exemplary embodiments of the present inventive concepts.
Figure 3B:
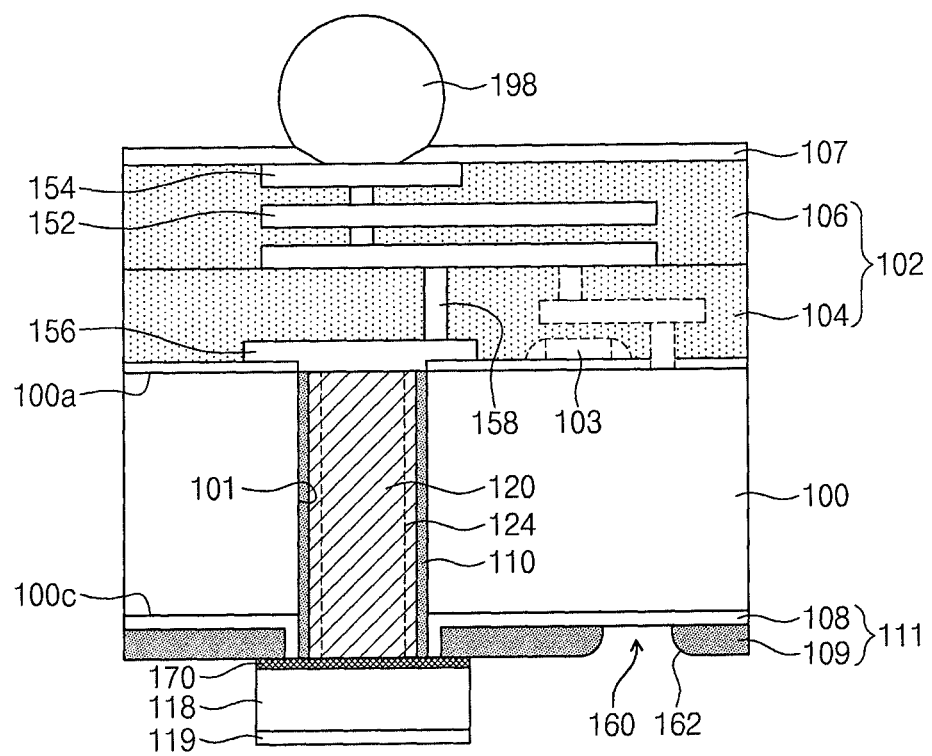

FIGS. 3A and 3B are cross-sectional views illustrating electrical interconnection parts according to some exemplary embodiments of the present inventive concepts.

Referring to FIG. 3A, in some embodiments, an electrical interconnection part 12 may have a via-last structure including the through-via 120, which may be formed following the sequential formation of the integrated circuit 103 and the metal interconnection 152. The through-via 120 may have a pillar shape which successively penetrates both the interlayer insulation layer 102 and the substrate 100. An upper interconnection 153 may be further provided on the upper insulation layer 107. The upper interconnection 153 may electrically connect the through-via 120 and the bonding pad 154 to each other. The through-via 120 may further penetrate the upper insulation layer 107 to be connected to the upper interconnection 153.

Referring to FIG. 3B, in some embodiments, an electrical interconnection part 13 may have a via-first structure including the through-via 120, which may be formed before the integrated circuit 103 and the metal interconnection 152 are sequentially formed. An additional interconnection 156 may be further provided on the active surface 100a of the substrate 100 with an insulation layer 133 therebetween. The through-via 120 may have a pillar shape which is electrically connected to the metal interconnection 152 and/or the integrated circuit 103 through a via 158. The via 158 may electrically connect the additional interconnection 156 and the metal interconnection 152 to each other.

Figure 4A:
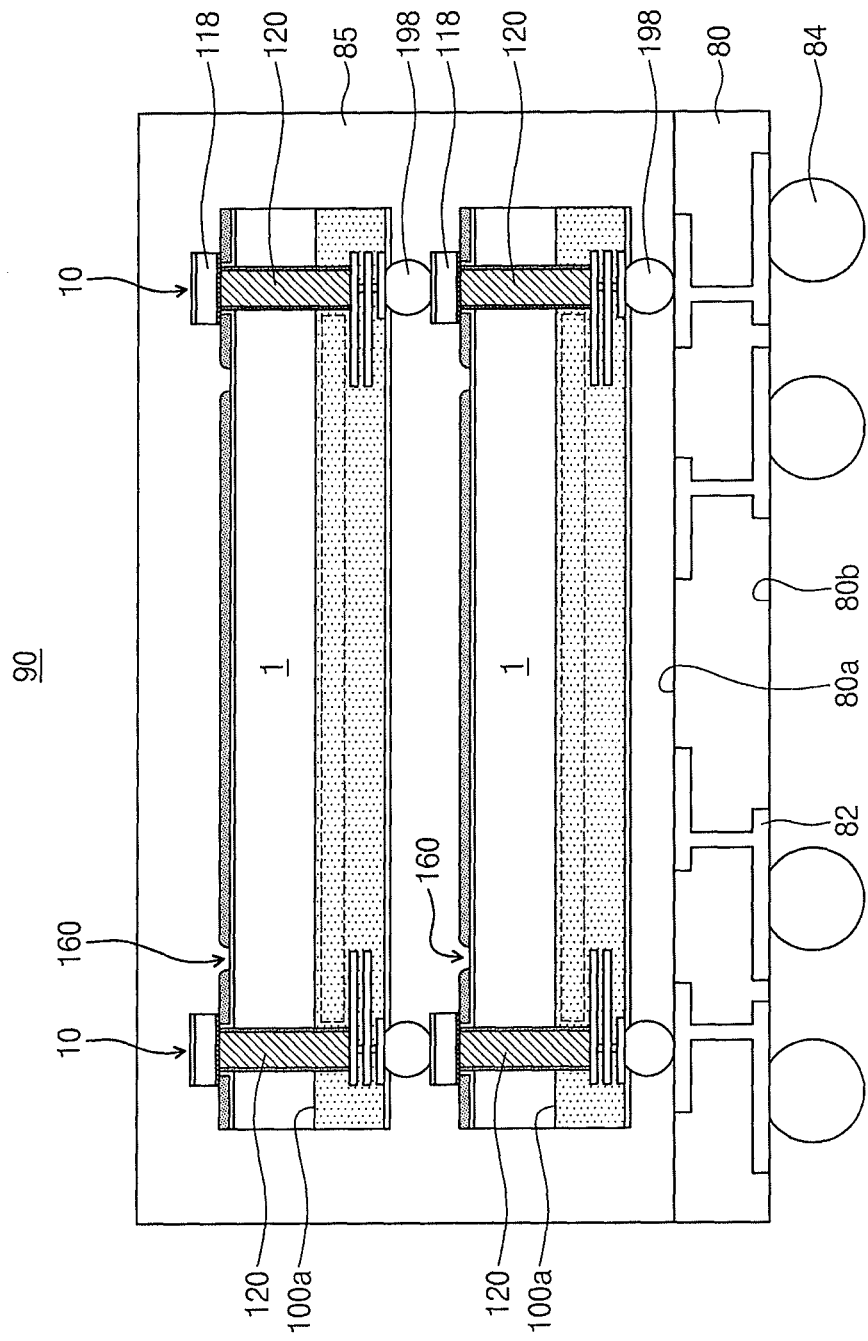

FIGS. 4A and 4B are cross-sectional views illustrating semiconductor packages according to some exemplary embodiments of the present inventive concepts.

Referring to FIG. 4A, a semiconductor package 90 may include a package substrate 80 and one or more semiconductor devices 1 of FIG. 1 mounted on the package substrate 80. The semiconductor package 90 may further include a molding layer 80 molding the semiconductor devices 1. The package substrate 80 may include a top surface 80a and a bottom surface 80b opposite to the top surface 80a. The package substrate 80 may be a printed circuit board (PCB) within which electrical interconnections 82 are included. The semiconductor devices 1 may be mounted on the top surface 80a of the package substrate 80 in a face down state, such that active surfaces 100a of the semiconductor devices 1 face the package substrate 80. Alternatively, the semiconductor devices 1 may be mounted on the top surface 80a of the package substrate 80 in a face up state.

In some embodiments, the semiconductor package 90 may further include one or more solder balls 84, which are adhered on the bottom surface 80b of the package substrate 80 and are connected to the electrical interconnections 82. In the present embodiment, the electrical connections between the semiconductor devices 1 and between the semiconductor devices 1 and the package substrate 80 may be realized by the through-vias 120. The electrical interconnection parts 10 of the semiconductor devices 1 may comprise one of the electrical interconnection parts 11 to 13 illustrated in the present specification. The alignment key 160 may be used for the alignment in the stack formation of the semiconductor devices 1 so that the accurate alignment between the semiconductor devices 1 may be realized.

Referring to FIG. 4B, a semiconductor package 95 may comprise a plurality of semiconductor devices 1a and 1b on the package substrate 80. The semiconductor devices 1a and 1b may be identical or similar to the semiconductor device 1 of FIG. 1A. For example, a first semiconductor device 1a may comprise a first upper terminal 198a which is vertically aligned with a first through-via 120a and a first lower terminal 118a which is redistributed. A second semiconductor device 1b may comprise a second upper terminal 198b which is not vertically aligned with a second through-via 120b and a second lower terminal 118b which is not redistributed. Alternatively, The second lower terminal 118b may be redistributed. The second upper terminal 198b may be electrically connected to the redistributed first lower terminal 118a. Other elements may be identical or similar to those of the semiconductor package 90 as illustrated in FIG. 4A.

Figure 5A:
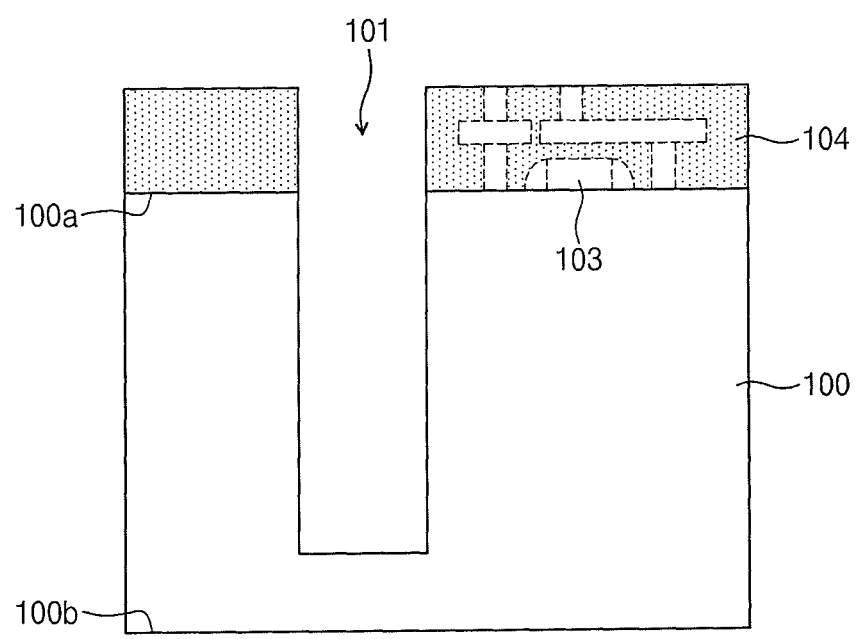
FIGS. 5A to 5P are cross-sectional views illustrating a method for fabricating a semiconductor device according to some embodiments of the inventive concepts.
Figure 5B:
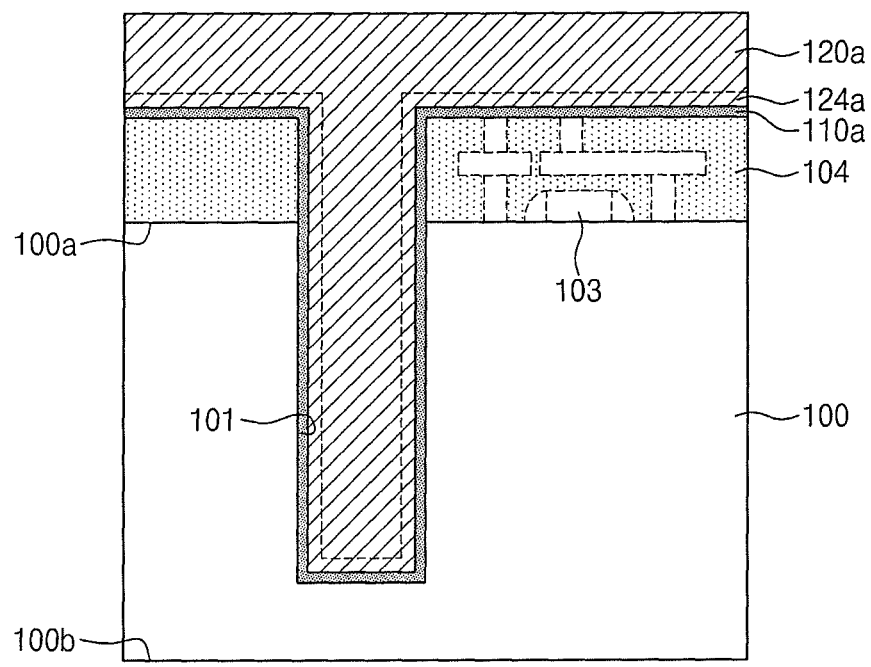
Figure 5C:
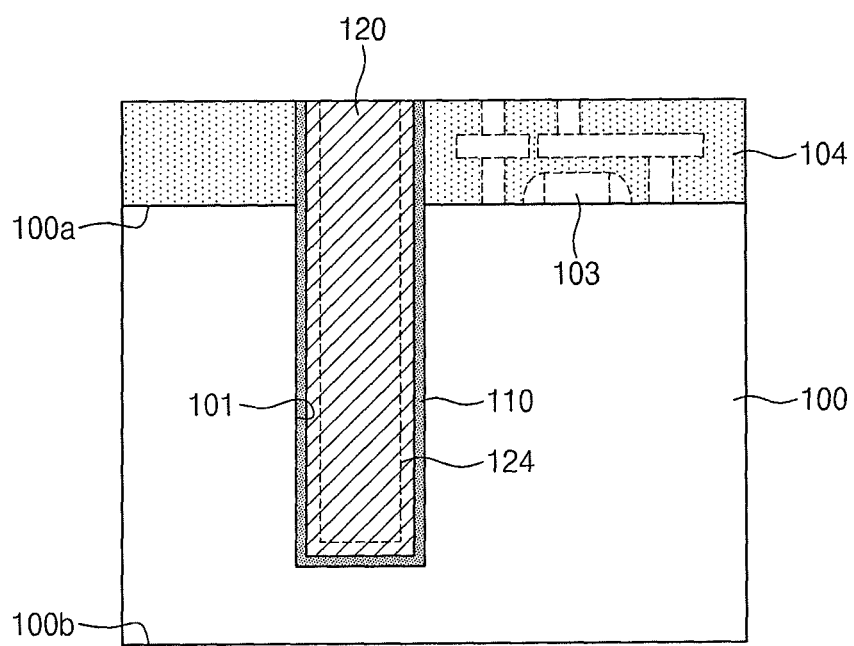
Figure 5D:
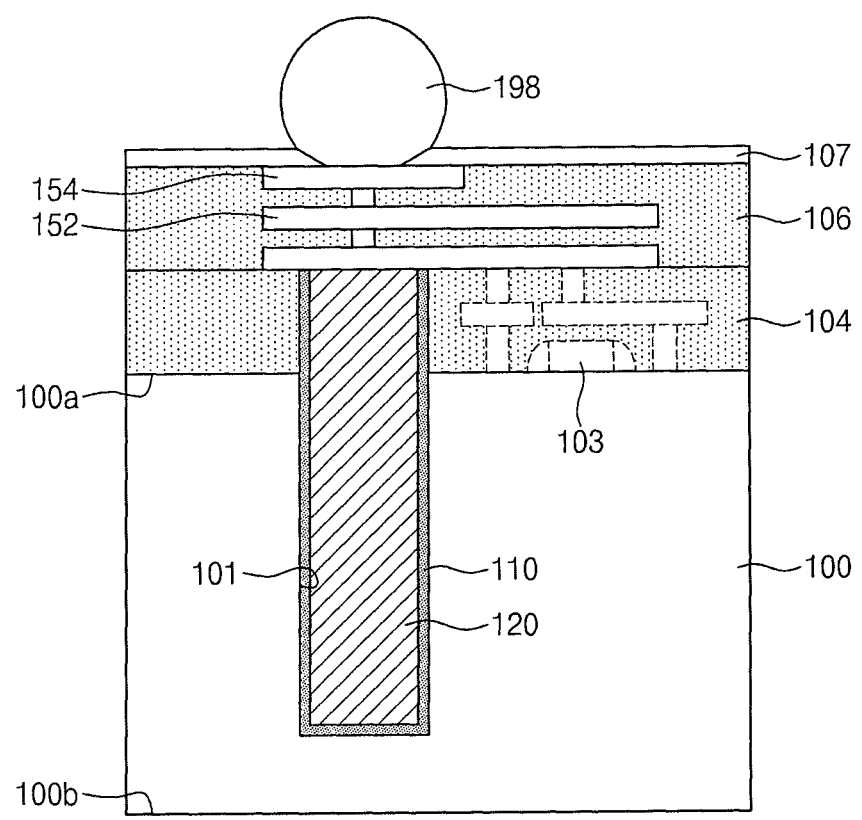
Figure 5E:
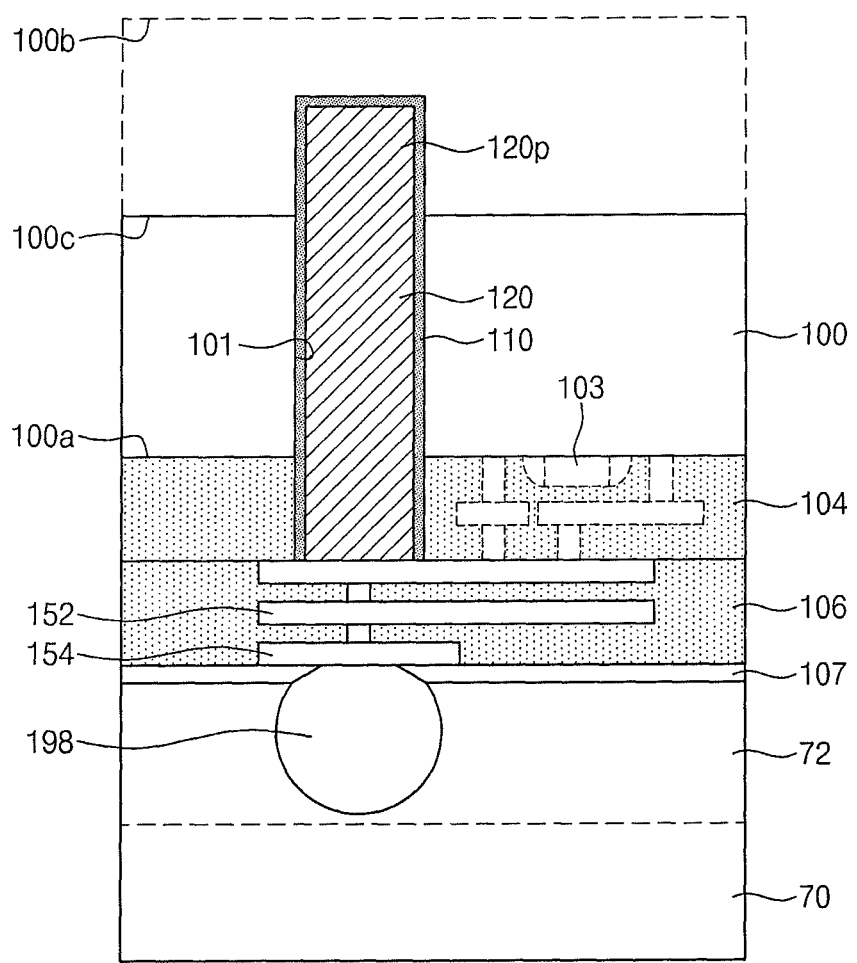
Figure 5F:
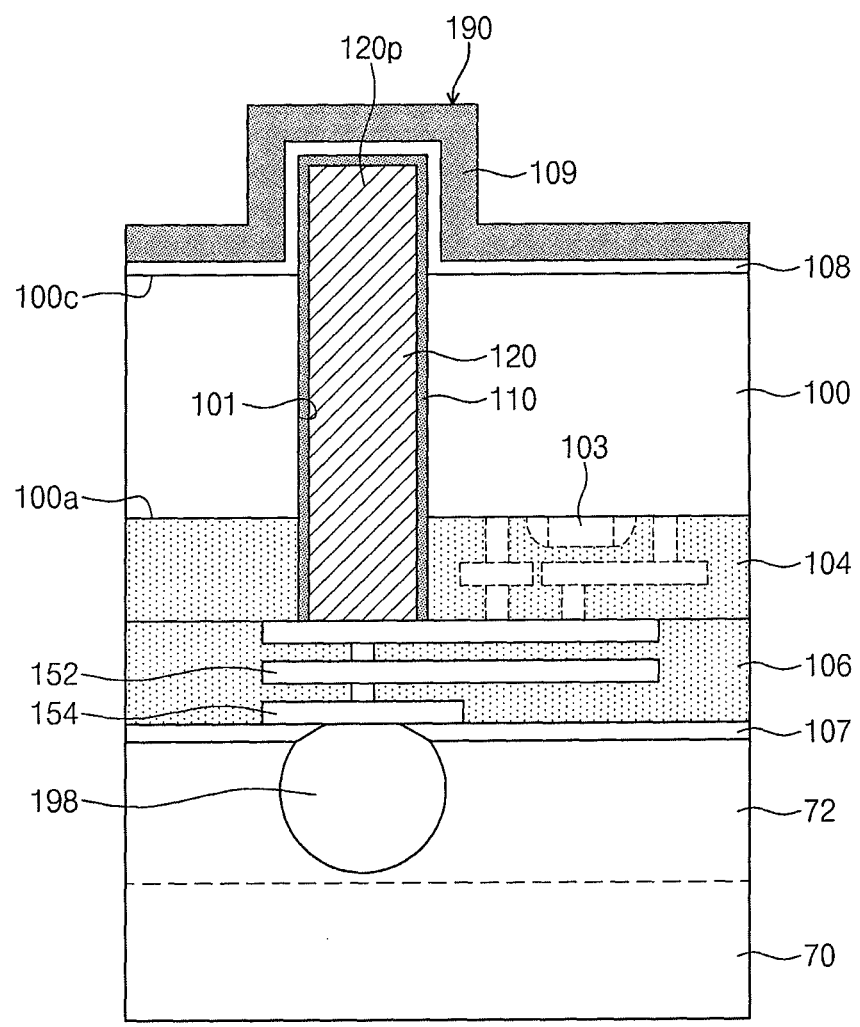
Figure 5G:
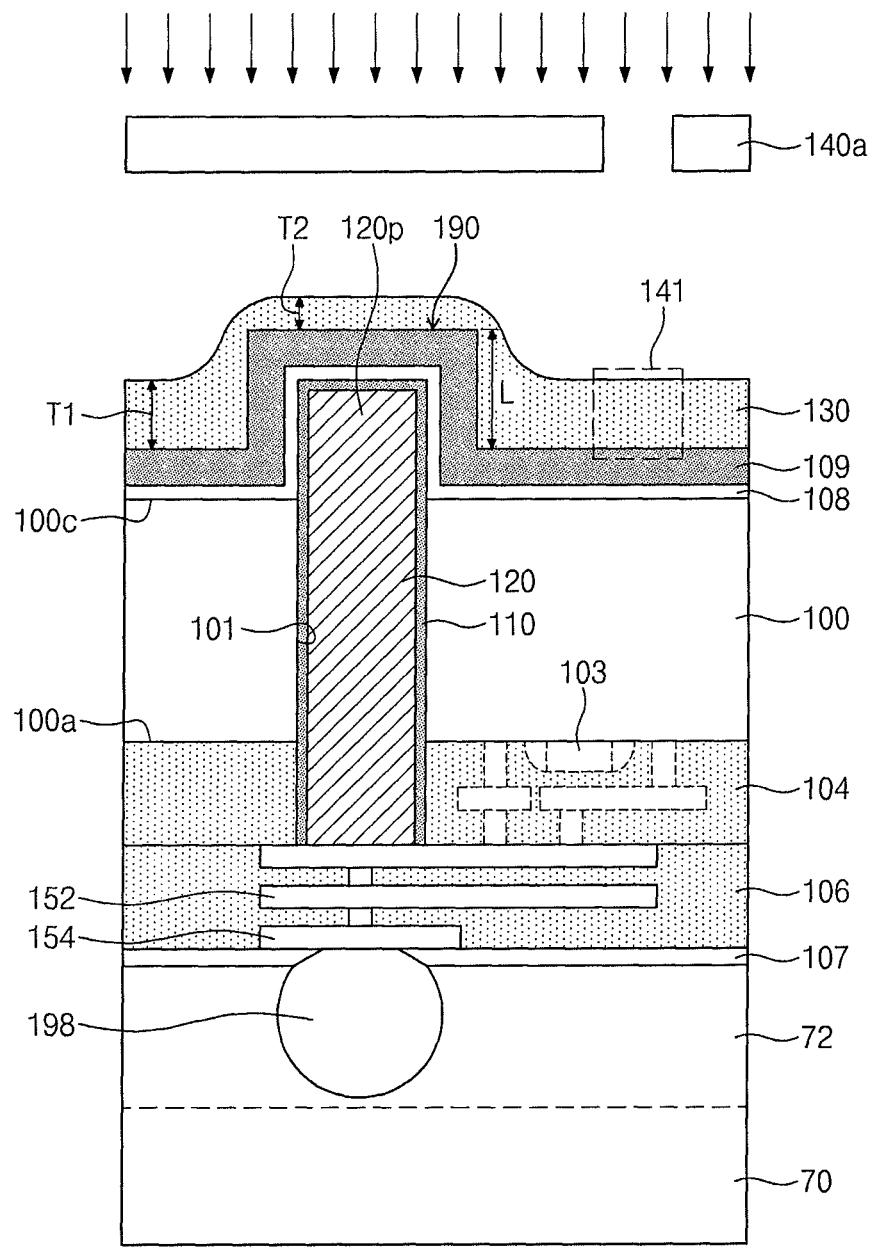
Figure 5H:
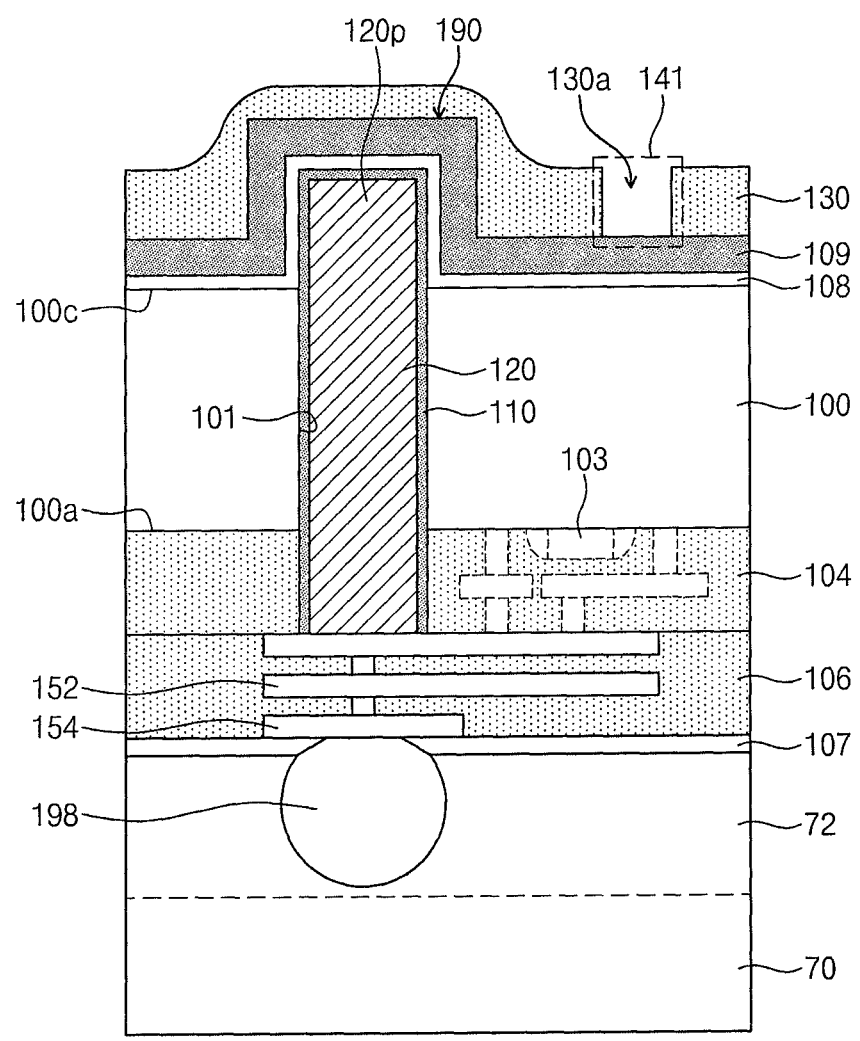
Figure 5I:
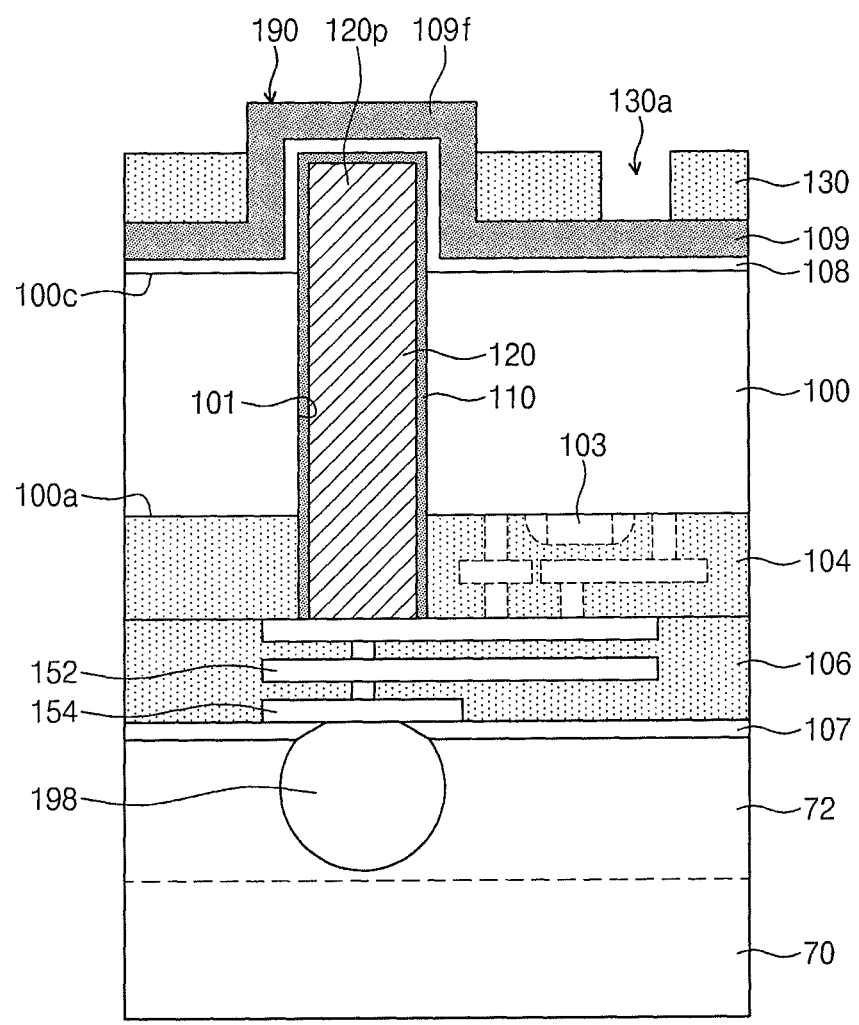
Figure 5J:
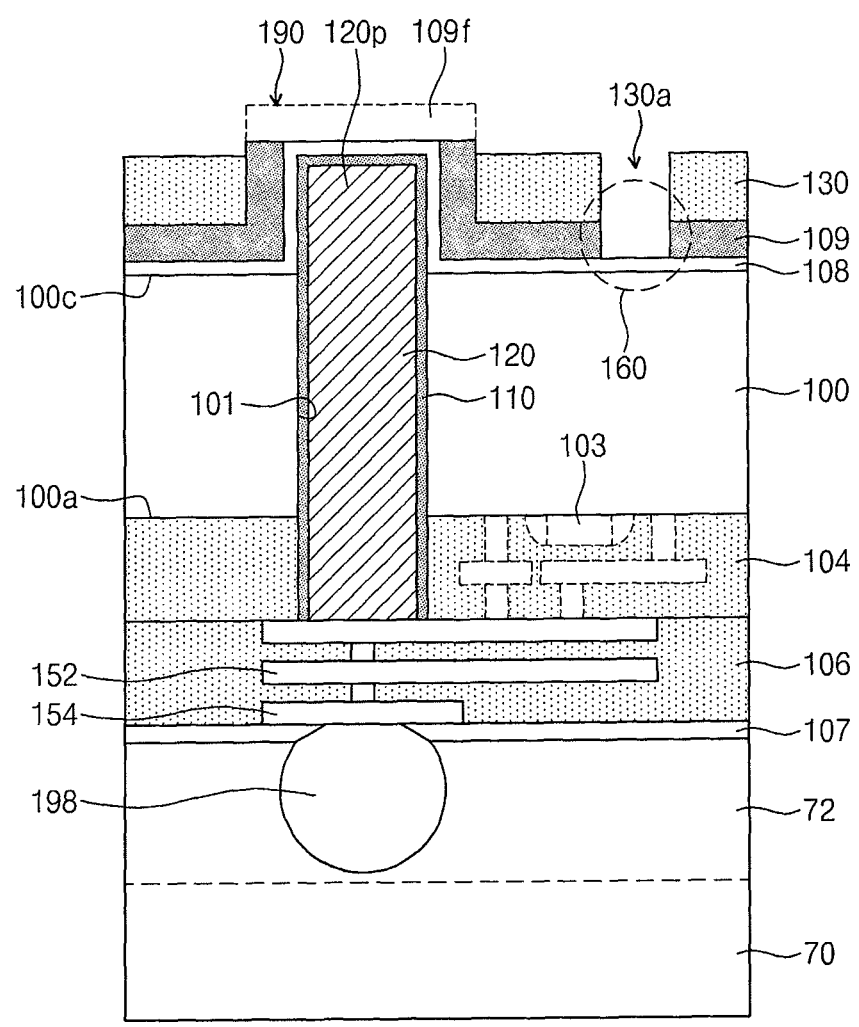
Figure 5K:
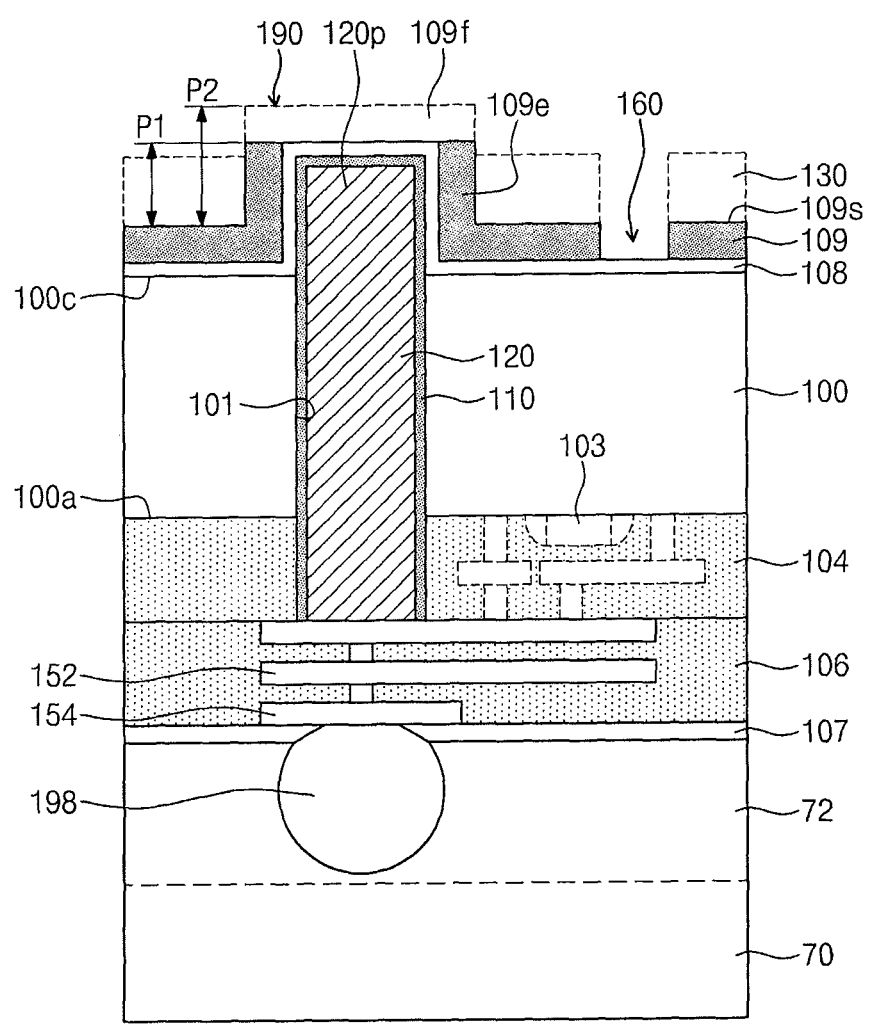
Figure 5L:
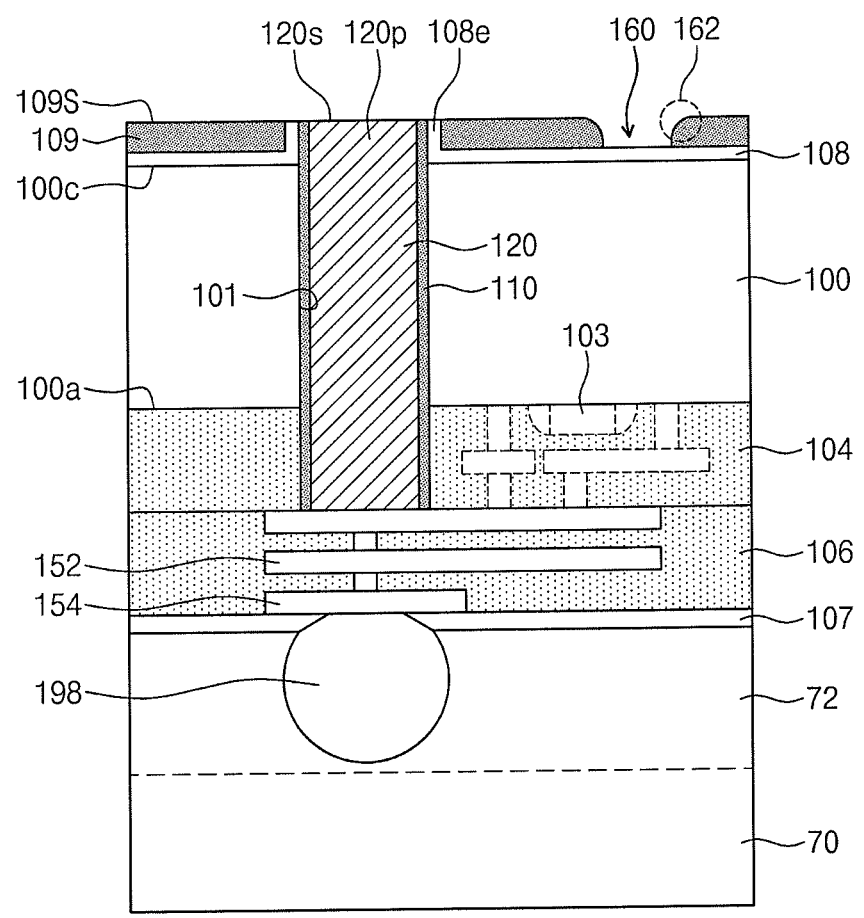
Figure 5M:
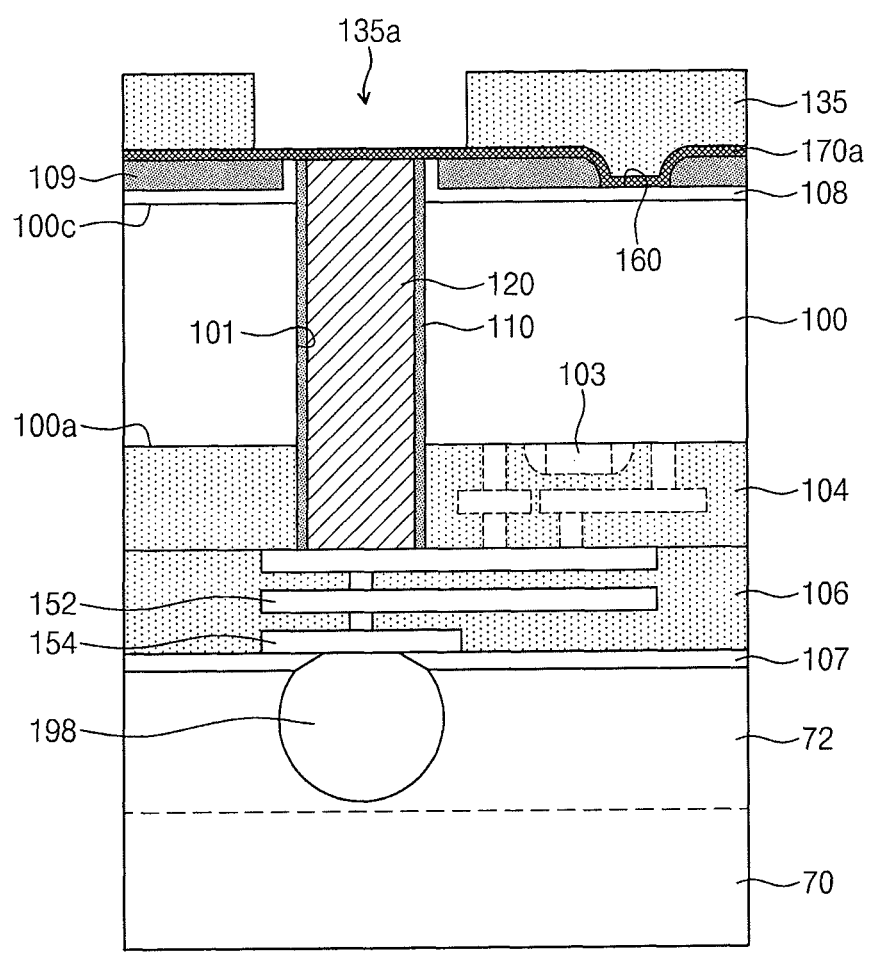
Figure 5N:
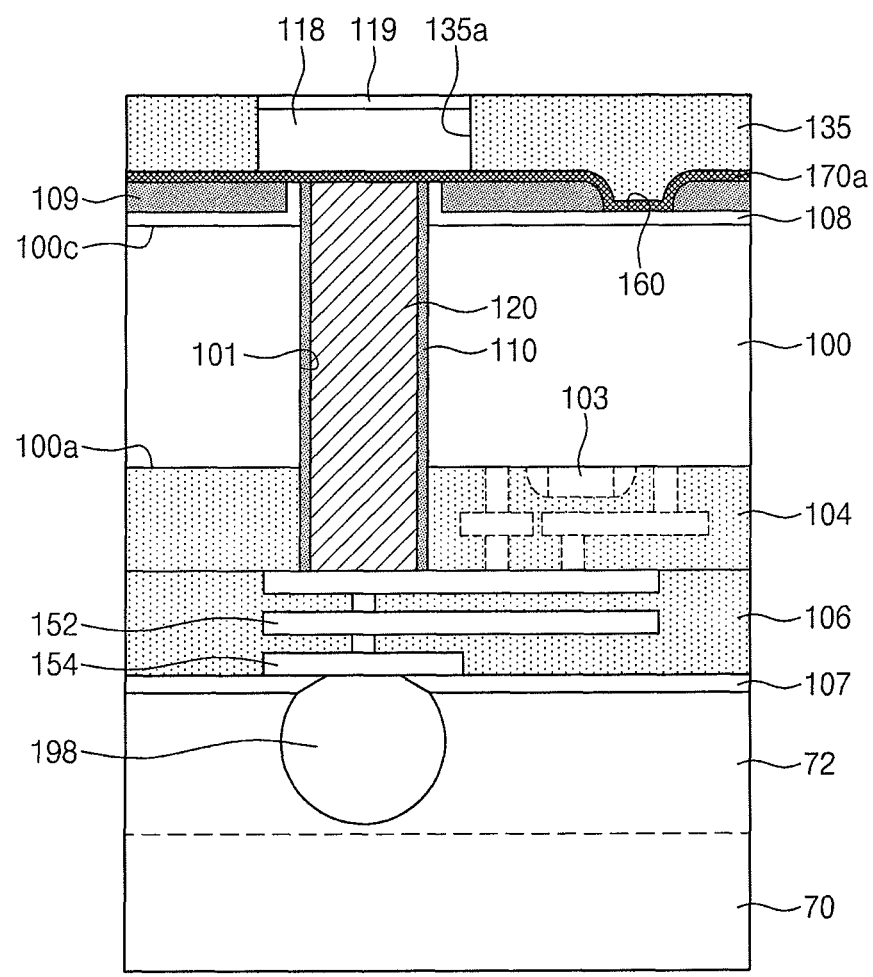
Figure 50:
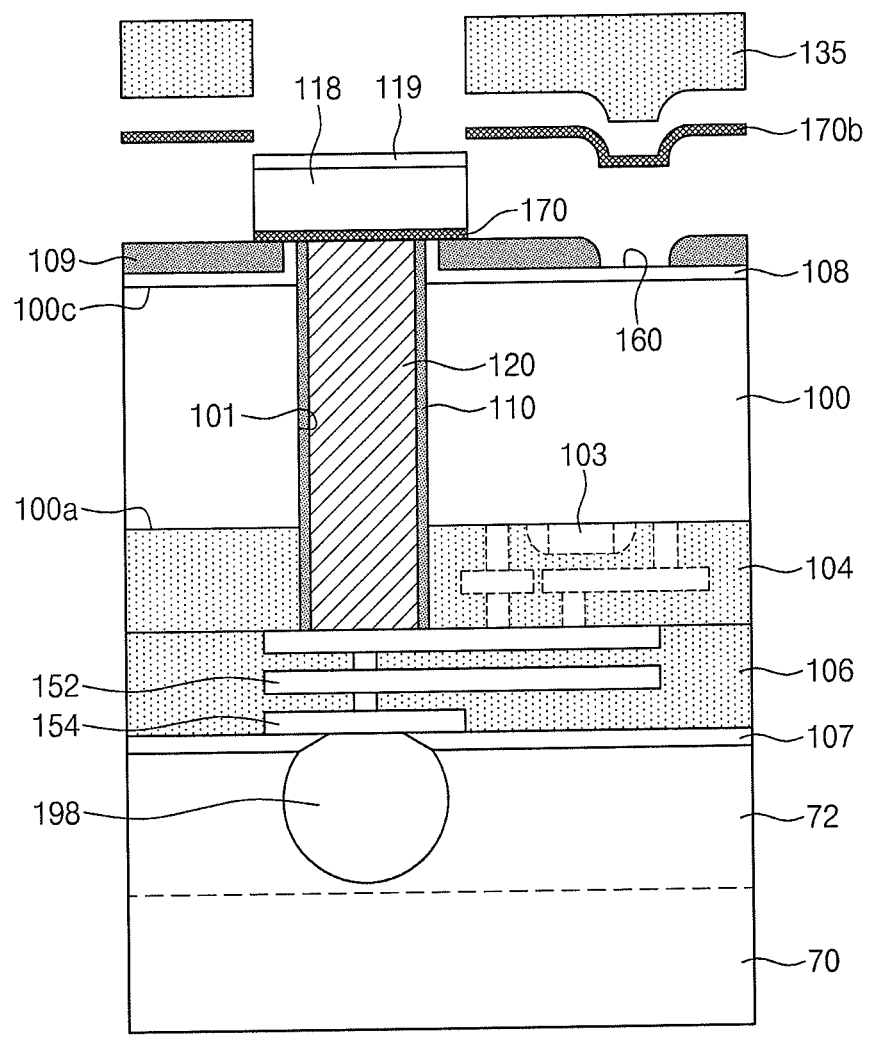
Figure 5P:
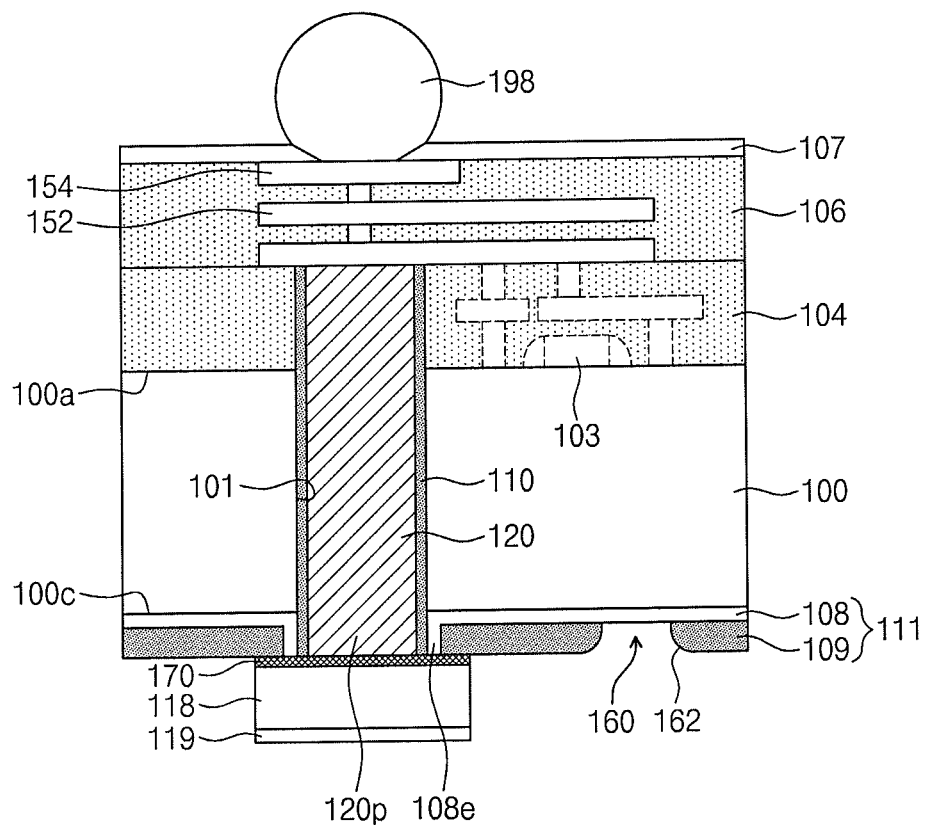

FIGS. 5A to 5P are cross-sectional views illustrating a method for fabricating a semiconductor device according to some embodiments of the inventive concepts.

Referring to FIG. 5A, a via-hole 101 may be formed in a substrate 100. The substrate 100 may be a semiconductor substrate (for example, a silicon substrate) having a top surface, or active surface, 100a provided with the integrated circuit 103 and a first bottom surface 100b opposite the active surface 100a. A first interlayer insulation layer 104 may be formed on the top surface 100a of the substrate 100 to cover the integrated circuit 103. The integrated circuit 103 may be configured to include a memory circuit, a logic circuit, or a combination thereof. The first interlayer insulation layer 104 may be formed by depositing a silicon oxide layer or a silicon nitride layer. The via-hole 101 may be formed to have a hollow pillar shape having an entrance near the top surface 100a of the substrate 100 but having such a depth as not to penetrate the first bottom surface 100b. The via-hole 101 may extend from the top surface 100a of the substrate 100 toward the first bottom surface 100b in a substantially vertical direction. The via-hole 101 may be formed by a dry etching process or a drilling process on the first interlayer insulation layer 104 and the substrate 100. In some embodiments, the via-hole 101 may be formed near the integrated circuit 103 (for example, a scribe lane or a region adjacent thereto) or at a region provided with the integrated circuit 103.

Referring to FIG. 5B, an insulating layer 110a may be formed to coat or cover an inner surface of the via hole 101 and then a conductive layer 120a may be formed on the substrate 100 to fill the via-hole 101. In some embodiments, the insulating layer 110a may be formed by depositing a silicon oxide layer or a silicon nitride layer. The conductive layer 120a may be formed by depositing or plating at least one of silicon, copper, tungsten, and aluminum. In a case where the conductive layer 120a includes copper, a metal layer 124a which operates as an anti-diffusion layer, may be further formed on the insulating layer 110a which may prevent copper from being diffused. The metal layer 124a may be formed by depositing metal, such as Ti, TiN, Cr, Ta, TaN, Ni, or any combination thereof, or other conductive material, which extends along the insulating layer 110a.

Referring to FIG. 5C, the conductive layer 120a and the insulating layer 110a may be planarized to expose the first interlayer insulation layer 104. The planarization process may be performed by an etch-back process or a chemical mechanical polishing (CMP) process. Due to the planarization process, the conductive layer 120a may be formed into a pillar-shaped through-via 120 which vertically penetrates the first interlayer insulation layer 104 and the substrate 100, and the insulating layer 110a may be formed into a via isolation layer 110 which electrically isolates the through-via 120 from the substrate 100. If the metal layer 124a is further formed, due to the planarization process, the metal layer 124a may be formed into a barrier layer 124 which prevents or reduces the likelihood of an element (e.g., copper) of the through-via 120 from being diffused into the substrate 100 or the integrated circuit 103. For brevity of the drawings, the barrier layer 124 will be omitted from the description hereinafter.

Referring to FIG. 5D, a back-end process may be performed. In some embodiments, a metal interconnection 152 of single-layered or multi-layered structure coupled to the through-via 120, a bonding pad 154 electrically connected to the metal interconnection 152, and a second interlayer insulation layer 106 covering the metal interconnection 152 and the bonding pad 154 may be formed on the first interlayer insulation layer 104. The metal interconnection 152 and the bonding pad 154 may be formed by depositing and patterning a metal such as Cu or Al. The second interlayer insulation layer 106 may be formed by depositing the same or similar insulator to the first interlayer insulation layer 104. For example, the second interlayer insulation layer 106 may be formed of a silicon oxide layer or a silicon nitride layer. An upper insulation layer 107 may be formed on the second interlayer insulation layer 106. In various embodiments, the upper insulation layer 107 may be formed by depositing and patterning a silicon oxide layer, a silicon nitride layer, or a polymer. The upper insulation layer 107 may be formed to expose the bonding pad 154. Additionally, a bump process may be further performed to form an upper terminal 198 (e.g., a solder ball or a solder bump) coupled to the bonding pad 154.

Referring to FIG. 5E, the bottom surface 100c of the substrate 100 may be recessed to a depth so as to cause the through-via 120 to protrude therefrom. For example, in various embodiments, the first bottom surface 100b of the substrate 100 may be recessed by an etching process using an etchant or a slurry capable of selectively removing the material (e.g., silicon) constituting the substrate 100, a CMP process, a grinding process, or any combination thereof. The above-mentioned recess or protrusion process may be performed until a second bottom surface 100c is exposed. The second bottom surface 100c may be more adjacent to the top surface 100a than the first bottom surface 100b. Due to the recess or protrusion process, a bottom end 120p of the through-via 120 may be exposed from the second bottom surface 100c. The recess or protrusion process may be performed in a state that the substrate 100 is supported by a support substrate 70. The support substrate 70 may be adhered to the top surface 100a of the substrate 100 with an adhesive layer 72 therebetween. The top surface 100a of the substrate 100 may face upward or downward when the recess or protrusion process is performed. In the present embodiment, the top surface 100a of the substrate 100 may correspond to an active surface and the second bottom surface 100c may correspond to a non-active surface. In other embodiments, the top surface 100a may be non-active and the bottom surface 100b may be active, or both the top 100a and bottom 100b surfaces may be active or inactive.

Referring to FIG. 5F, in some embodiments, a silicon oxide layer or a silicon nitride layer may be deposited on the non-active surface 100c of the substrate 100 to form a first lower insulation layer 108 and a second lower insulation layer 109. For example, a silicon oxide layer may be deposited on the non-active surface 100c to form the first lower insulation layer 108, and a silicon nitride layer may be deposited on the first lower insulation layer 108 to form the second lower insulation layer 109. The first lower insulation layer 108 may have a thickness less than that of the second lower insulation layer 109. The first lower insulation layer 108 may operate to fill gaps between the non-active surface 100c and the second lower insulation layer 109 and between the non-active surface 100c and the bottom end 120p of the through-via 120. The first and second lower insulation layers 108 and 109 may have a bending or meandering cross-sectional shape as a result of their covering the protruding bottom end 120p of the through-via 120 on the non-active surface 100c. Therefore, in this manner, a protrusion section 190 may be provided on the non-active surface 100c of the substrate 100. Alternatively, in other embodiments, one of the first and second lower insulation layers 108 and 109 may be omitted so as to be a single layer. For example, in some embodiments, the formation of the first insulation layer 108 may be skipped. In other embodiments, more than two insulation layers 108, 109 can be used.

Referring to FIG. 5G, in some embodiments, a mask layer 130 may be formed on the second lower insulation layer 109 and then the mask layer 130 may be exposed to light energy by a photolithography process using a photomask 140a. For example, a positive photoresist may be coated on the second insulation layer 109 to form the mask layer 130 and then a local region 141 of the mask layer 130 may be exposed to light. The local region 141 may be provided to define an alignment key (see reference 160 of FIG. 5J) through subsequent processes. The photomask 140a may comprise a binary mask which is configured to fully expose the mask layer 130 so that the local region 141 may be formed into a full exposure region (e.g., 100% exposure). In some embodiments, the mask layer 130 may include a hillock which rises upward on the protrusion section 190. The mask layer 130 may have a thickness that is irregular. For example, the mask layer 130 may have a portion with a first thickness T1 on the non-active surface 100c and a portion with a second thickness T2 less than the first thickness T1 on the protrusion section 190. The first thickness T1 of the mask layer 130 may be same or less than a protrusion length L of the protrusion section 190. Alternatively, the first thickness T1 of the mask layer 130 may be greater than the protrusion length L of the protrusion section 190.

Referring to FIG. 5H, an opening 130a may be formed to expose the second lower insulation layer 109. The opening 130a may be formed by patterning the mask layer 130 with a photographic developer capable of selectively removing the exposure region 141. The opening 130a may have a shape such as circle, ellipse, oval, triangle, rectangle, star, cross or dash when perceived from the perspective of a plan view.

Referring to FIG. 5I, in some embodiments, the mask layer 130 may be recessed. The recess process may expose a portion 109f (referred to as a capping part hereinafter) of the second lower insulation layer 109 of the protrusion section 190 which is formed on the bottom end 120p of the through-via 120.

Referring to FIG. 5J, an alignment key 160 may be formed. The capping part 109f may be removed simultaneously with the formation of the alignment key 160. For example, the second lower insulation layer 109 may be patterned by an etching process (e.g., dry etch) using the recessed mask layer 130. Due to the patterning of the second lower insulation layer 109, the alignment key 160 may be formed under the opening 130a, and the capping part 109f may be removed simultaneously with the formation of the alignment key 160.

Referring to FIG. 5K, the mask layer 130 may be stripped and then the remaining portion of the protrusion section 190 may be removed by a planarization process. Alternatively, the mask layer 130 and the protrusion section 190 may be removed simultaneously in a planarization process. In some embodiments, the planarization process may be performed using a CMP process. Since the capping part 109f of the second lower insulation layer 109 has been previously removed as illustrated in FIG. 5J, a polishing amount or depth P1 of the CMP process may be relatively reduced as compared the amount of polishing that would otherwise be necessary to remove the capping part 109f by CMP. In some embodiments, the second lower insulation layer 109 may have an extension 109e which extends in a vertical direction from the non-active surface 100c to cover a sidewall of the bottom end 120p. The planarization process (e.g., CMP) may be performed until a surface 109s under the extension 109e of the second lower insulation layer 109 is exposed or polished. The CMP process may be thereby simplified because the capping part 109f is removed prior to the performing of CMP process, and therefore the burden of the CMP process is reduced from a depth of P2 to a depth of P1. Moreover, the decreased depth P1 of the CMP may prevent or reduce the likelihood of breakage or damage of the through-via 120.

According to exemplary embodiments, the formation of the alignment key 160 as illustrated in FIG. 5J and the removal of the mask layer 130 as illustrated in FIG. 5K may be performed in a state whereby the through-via 120 is not exposed. For that reason, the through-via 120 may be free of contamination due to byproducts created in etching processes for the formation of the alignment key 160 and the removal of the mask layer 130. Additionally, there may be no room for particles to be generate as a result of exposure of the through-via 120.

Referring to FIG. 5L, the planarization process may remove the protrusion section 190 to expose a planarized bottom surface 120s of the through-via 120. Due to the planarization process, a surface 109s of the second lower insulation layer 109 may be planarized and coplanar with the bottom surface 120s of the through-via 120. In some embodiments, the resulting alignment key 160 may have rounded corners 162. When the planarization process is performed, edge or corner portions 162 of the second lower insulation layer 109 may be given locally increased pressure. Consequently, the resulting edge portions 162 or corners of the alignment key 160, may have a rounded cross-section or profile. In some embodiments, as previously described in FIG. 2D, a thickness of the corner 162 may be greater or less than half the thickness of the second lower insulation layer 109 or half the thickness of the first and second lower insulation layers 108 and 109. In some embodiments, the bottom end 120p of the through-via 120 may not be completely polished, thereby the through-via 120 may have a shape that protrudes outward from the non-active surface 100c. The first lower insulation layer 108 may be polished to have an "L" shape including an extension 108e which surrounds the sidewall of the bottom end 120p of the through-via 120. The via isolation layer 110 may be partially removed to have a protruded portion which protrudes outward from the non-active surface 100c when the protrusion section 190 is polished. The protruded portion of the via isolation layer 110 may be disposed between the bottom end 120p of the through-via 120 and the extension 108e of the first lower insulation layer 108.

Referring to FIG. 5M, a metal layer 170a may be formed on the non-active surface 100c and a mask layer 135 may be formed on the metal layer 170a. The metal layer 170a may comprise Ni, Au or Ni/Au. The mask layer 135 may be formed by coating and patterning a photoresist. The mask layer 135 may comprise an opening 135a vertically aligned with the through-via 120.

Referring to FIG. 5N, a backside pad 118 may be formed on the metal layer 170a by an electroplating process. In some embodiments, the backside pad 118 may comprise Cu, Al, Ni or any combination thereof. A plating layer 119 may be further formed on the backside pad 118. The plating layer 119 may comprise Au, Ag, Pt or any combination thereof. The plating layer 119 may be provided for preventing an oxidation of the backside pad 118 and improving an electrical contact between the backside pad 118 and any electrical interconnection such as bonding wire, solder ball, and etc. The backside pad 118 and/or the plating layer 119 may be confined within the opening 135a.

Referring to FIG. 5O, the mask layer 135 may be removed by a strip process or an ashing process. The removal of the mask layer 135 may expose a metal layer 170b which is a portion of the metal layer 170a covered by the mask layer 135. The exposed metal layer 170b may be removed by an etching process to remain an under bump metal layer 170, which includes another portion of the metal layer 170a covered by the backside pad 118, between the backside pad 118 and the through-via 120.

Referring to FIG. 5P, the adhesive layer 72 and the support substrate 70 may be detached from the substrate 100. Accordingly, there may be formed an electrical interconnection part 11 comprising the through-via 120, a multi-layered lower insulation layer 111 which includes the first and second lower insulation layers 108 and 109 stacked on the non-active surface 100c, and the alignment key 160 which is formed by patterning the second lower insulation layer 109. The through-via 120 may comprise the bottom end 120p protruding outward from the non-active surface 100c. The first lower insulation layer 108 may have the "L" shape including the extension 108e which surrounds the sidewall of the bottom end 120p of the through-via 120. In some embodiments, the corners 162 of the alignment key 160 may be rounded by the CMP process for planarizing the protrusion section 190 as illustrated in FIG. 5K.

Figure 6A:
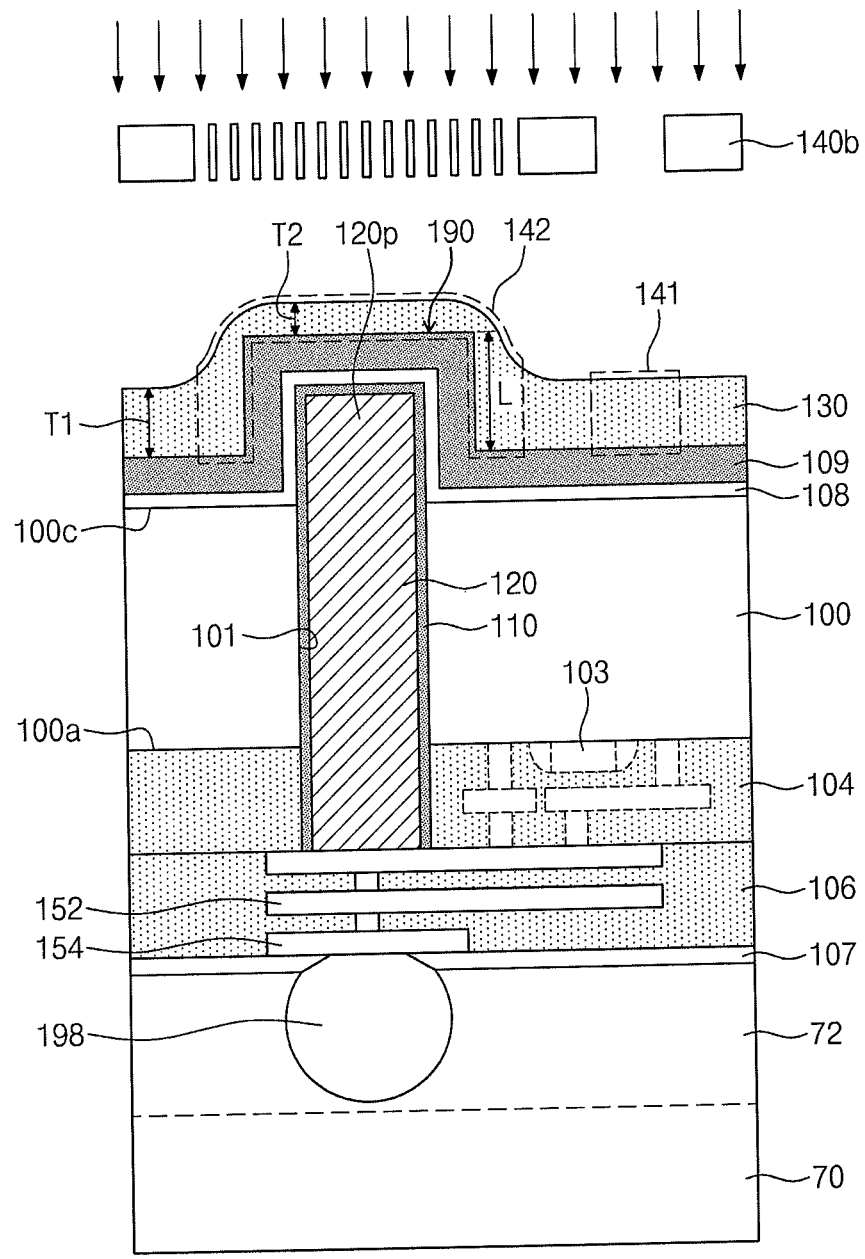
FIGS. 6A to 6C are cross-sectional views illustrating a method for fabricating a semiconductor device according to some embodiments of the inventive concepts.
Figure 6B:
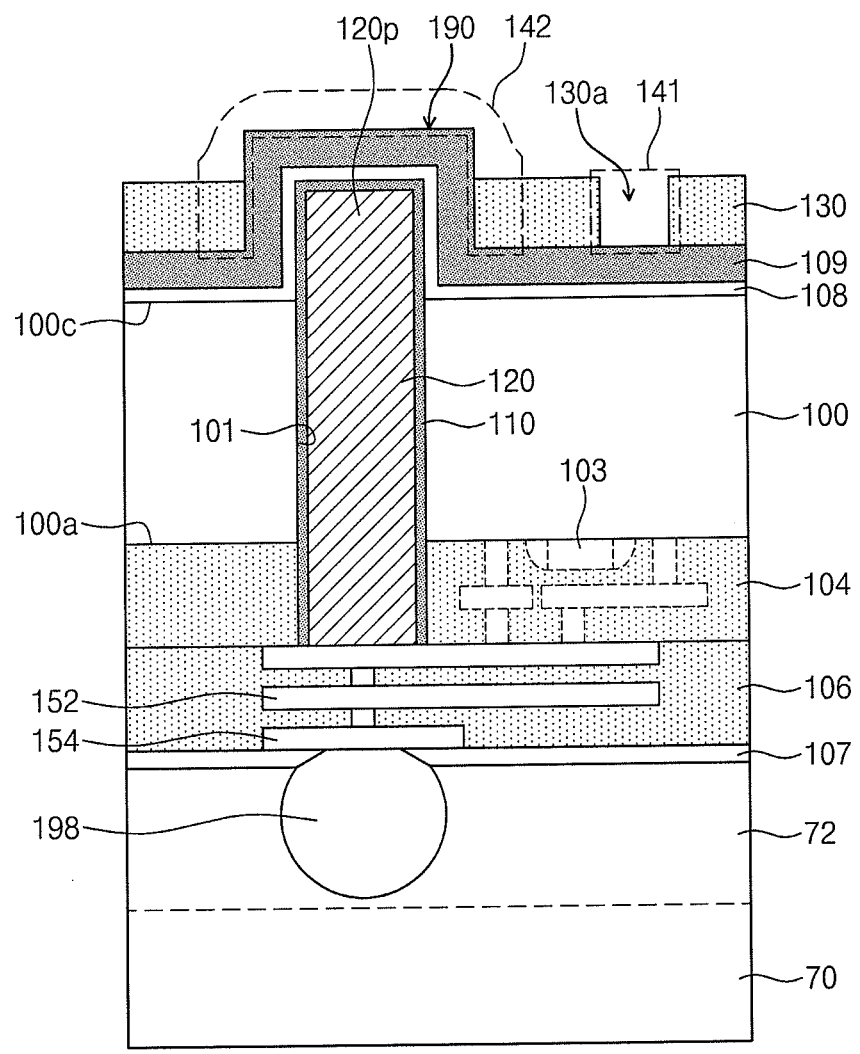
Figure 6C:
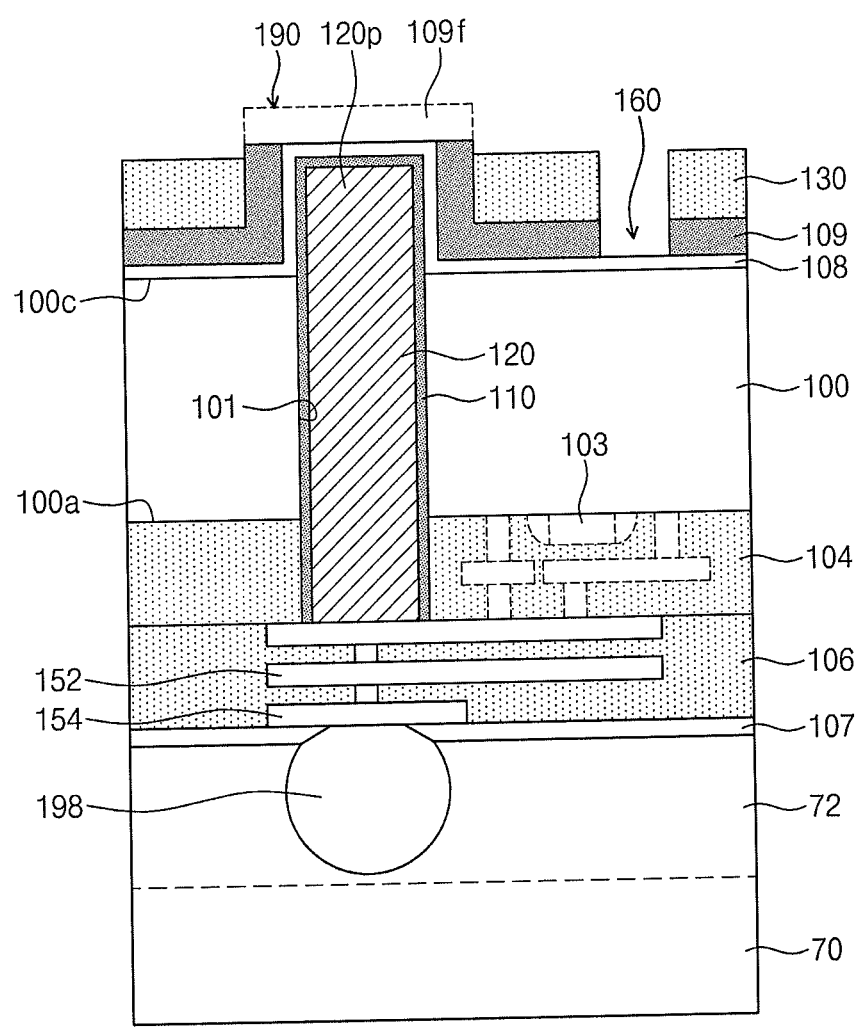

FIGS. 6A to 6C are cross-sectional views illustrating a method for fabricating a semiconductor device according to some embodiments of the inventive concepts.

Referring to FIG. 6A, the mask layer 130 may be formed by coating the positive photoresist on the non-active surface 100c provided with the protrusion section 190 formed thereon as illustrated in FIGS. 5A to 5G. The mask layer 130 may have the first thickness T1 on the non-active surface 100c and the second thickness T2 less than the first thickness T1 on the protrusion section 190. Next, the mask layer 130 may be exposed to light in connection with a photolithography process using a photomask 140b. Through the photolithography process, a first local region 141 and a second local region 142 may be exposed to light. The first local region 141 may be provided to define an alignment key (see reference number 160 of FIG. 6C) and the second local region 142 may be disposed on the protrusion section 190. In some embodiments, the photomask 140b may comprise a half-tone phase shift mask (or attenuated phase shift mask) which is configured to fully and partially expose the mask layer 130. In some embodiments, the first local region 141 may be transformed into a full exposure region (e.g., 100% exposure) and the second local region 142 may be transformed into a partial exposure region (e.g., 50% exposure).

Referring to FIG. 6B, the mask layer 130 may be patterned with a photographic developer capable of selectively removing the first and second exposure regions 141 and 142. The first exposure region 141 may be fully removed to form the opening 130a which exposes the second lower insulation layer 109, and the second exposure region 142 may be partially removed to expose the protrusion section 190. In some embodiments, since the protrusion section 190 is exposed by partially removing the second exposure region 142, there may be no need to recess the mask layer 130 for exposing the protrusion 190.

Referring to FIG. 6C, the alignment key 160 may be formed. The capping part 109f of the second lower insulation layer 109 may be removed simultaneously during the formation of the alignment key 160. For example, the second lower insulation layer 109 may be patterned by an etching process using the mask layer 130 to form the alignment key 160 under the opening 130a, and the capping part 109t of the second lower insulation layer 109 may be removed at the same time. Next, there may be formed the electrical interconnection part 11 of FIG. 5P by stripping the mask layer 130, planarizing the protrusion section 190 and electroplating, for example, according to the processes illustrated at FIGS. 5K to 5P.

Figure 7A:
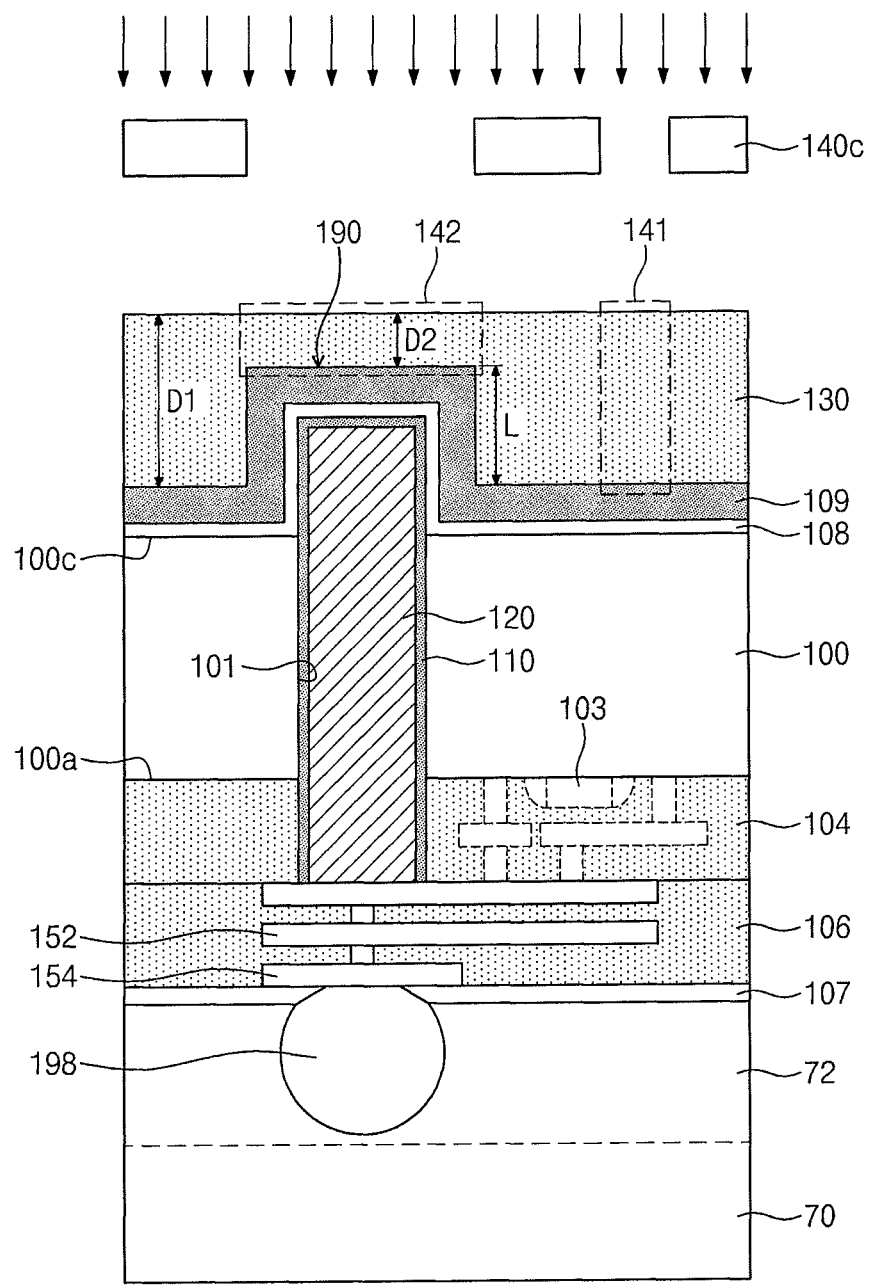
FIGS. 7A to 7C are cross-sectional views illustrating a method for fabricating a semiconductor device according to some embodiments of the inventive concepts.
Figure 7B:
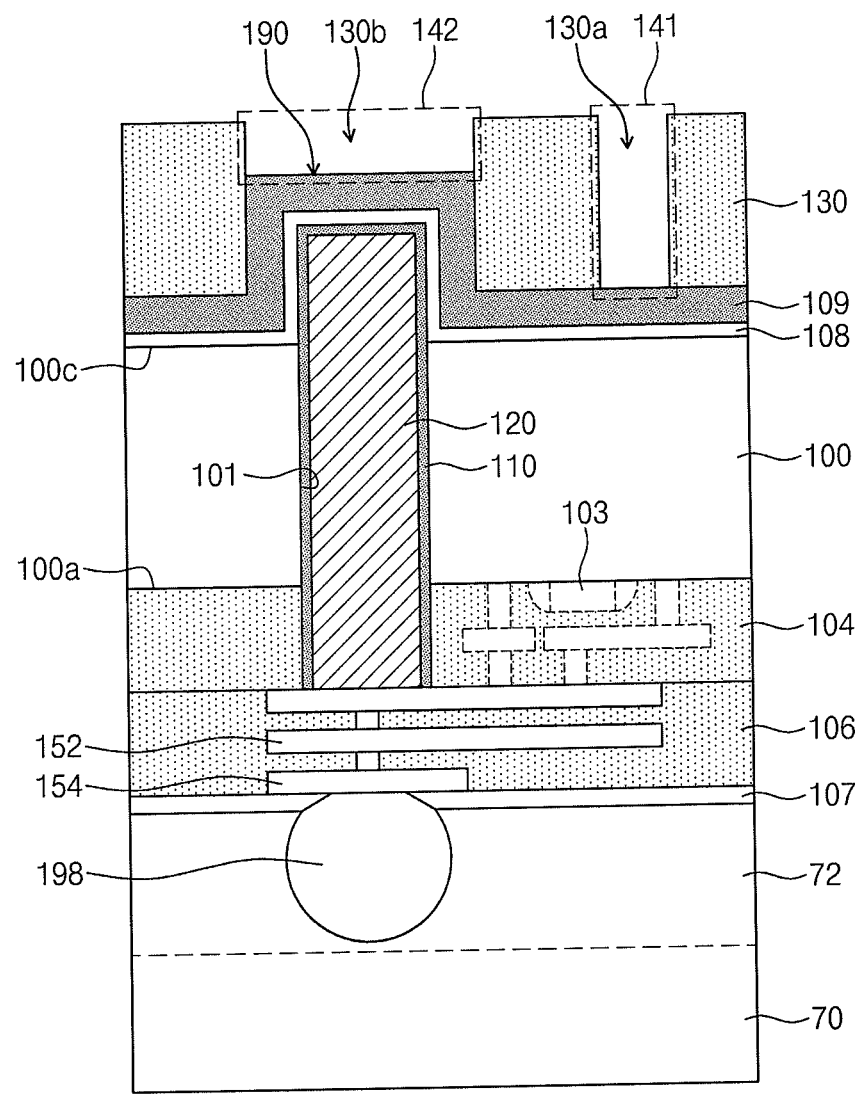
Figure 7C:
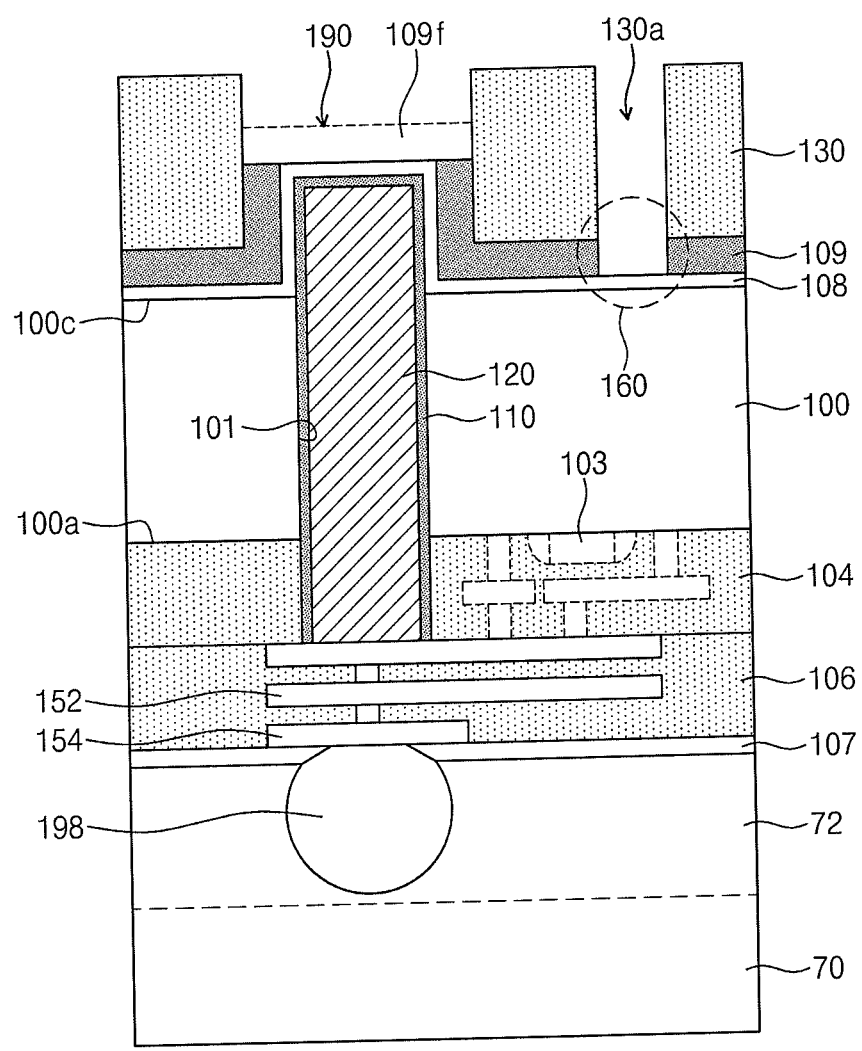

FIGS. 7A to 7C are cross-sectional views illustrating a method for fabricating a semiconductor device according to some embodiments of the inventive concepts.

Referring to FIG. 7A, the mask layer 130 may be formed by coating the positive photoresist on the non-active surface 100c provided with the protrusion section 190 formed thereon as illustrated in FIGS. 5A to 5G. Next, the mask layer 130 may be exposed to light by a photolithography process using a photomask 140c. Through the photolithography process, a first local region 141 and a second local region 142 may be exposed to light. The first local region 141 may be provided to define an alignment key (see numerical 160 of FIG. 7C) and the second local region 142 may be disposed on the protrusion section 190. The mask layer 130 may cover the non-active surface 100c and the protrusion section 190. In some embodiments, the mask layer 130 may have an even, or level, or planar, top surface. The mask layer 130 may have a first thickness D1 on the non-active surface 100c and a second thickness D2 less than the first thickness D1 on the protrusion section 190. The first thickness D1 of the mask layer 130 may be greater than the protrusion length L of the protrusion section 190. The photomask 140c may be a binary mask which is configured to fully expose the mask layer 130 so that each of the first and second local regions 141 and 142 may be formed into a full exposure region (e.g., 100% exposure). Alternatively, the photomask 140c may be a half-tone phase shift mask (or attenuated phase shift mask) which is configured to fully and partially expose the mask layer 130 so that the first local region 141 may be formed into a full exposure region (e.g., 100% exposure) and the second local region 142 may be formed into a partial exposure region (e.g., 50% exposure).

Referring to FIG. 7B, the mask layer 130 may be patterned with a photographic developer capable of selectively removing the first and second exposure regions 141 and 142. The first exposure region 141 may be removed to form a first opening 130a which exposes the second lower insulation layer 109, and the second exposure region 142 may be removed to form a second opening 130b which exposes the protrusion section 190. In some embodiments, since the protrusion section 190 is exposed through the second opening 130b, there may be no need to recess the mask layer 130 for exposing the protrusion 190.

Referring to FIG. 7C, the alignment key 160 may be formed. The capping part 109f of the second lower insulation layer 109 may be removed simultaneously during the formation of the alignment key 160. For example, the second lower insulation layer 109 may be patterned by an etching process using the mask layer 130 to form the alignment key 160 under the first opening 130a and the capping part 109t of the second lower insulation layer 109 may be removed at the same time. Next, there may be formed the electrical interconnection part 11 of FIG. 5P by stripping the mask layer 130, planarizing the protrusion section 190 and electroplating, etc. as illustrated in FIG. 5K to 5P.

Figure 8A:
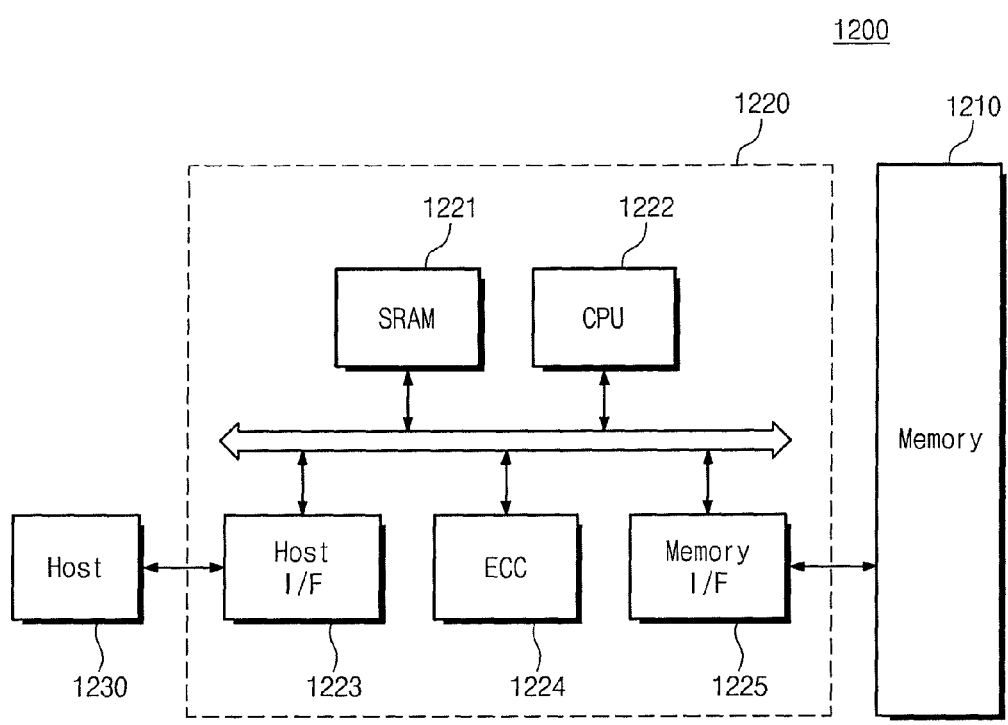
FIG. 8A is a schematic block diagram illustrating an example of memory card including at least one of electrical interconnection parts according to some embodiments of the present inventive concepts.

FIG. 8A is a schematic block diagram illustrating an example of memory cards including at least one of electrical interconnection parts according to exemplary embodiments of the present inventive concepts.

Referring to FIG. 8A, a memory card 1200 may include a memory controller 1220 generally controlling data exchange between a host and the flash memory device 1210. An SRAM 1221 is used as a work memory of a processing unit 1222. A host interface 1223 has a data exchange protocol of a host connected to the memory card 1200. An error correction coding block 1224 detects and corrects errors contained in data read from the multi-bit flash memory device 1210. A memory interface 1225 interfaces the flash memory device 1210 according to the example embodiments. The processing unit 1222 generally controls data exchange of the memory controller 1220. At least one of the memory device 1210, SRAM 1221 and the processing unit 1222 may comprise at least one of the semiconductor device 1 and semiconductor packages 90 and 95 according to the exemplary embodiments.

Figure 8B:
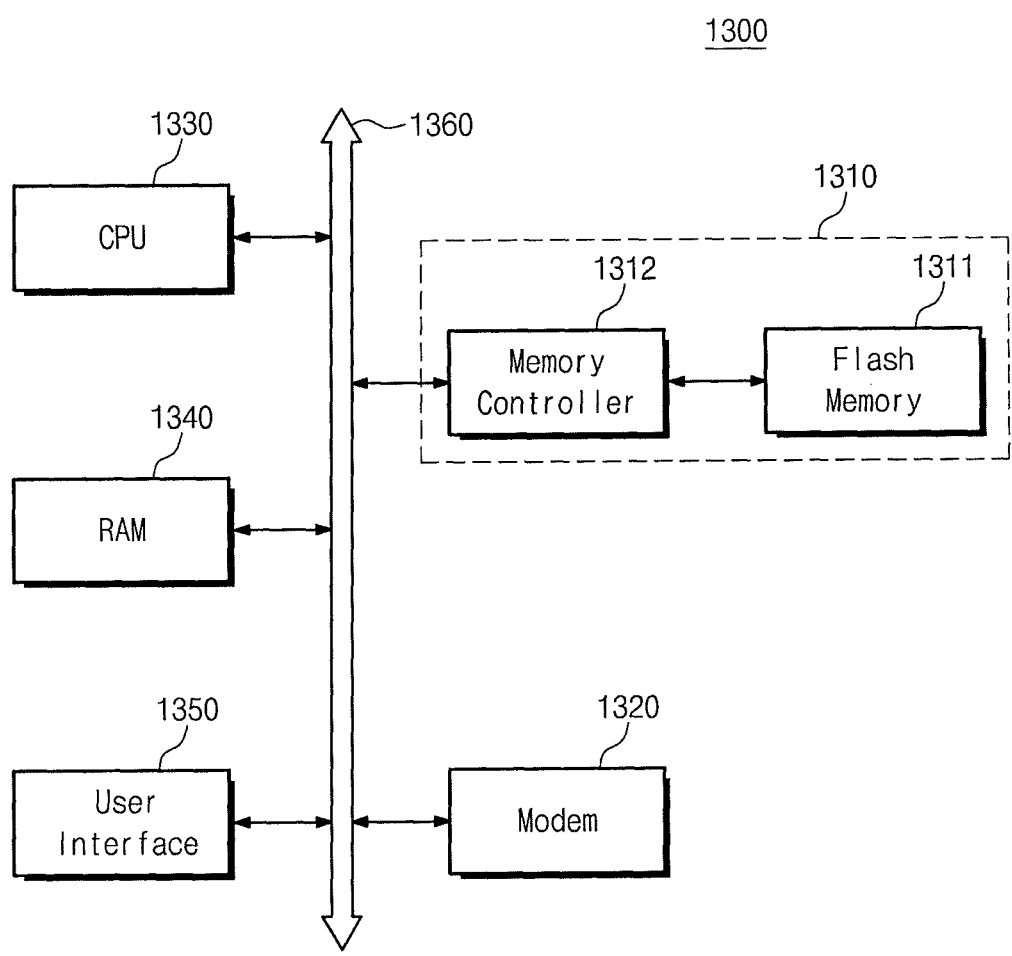
FIG. 8B is a schematic block diagram illustrating an example of information process system including at least one of electrical interconnection parts according to some embodiments of the present inventive concepts.

FIG. 8B is a schematic block diagram illustrating an example of information process system including at least one of electrical interconnection parts according to exemplary embodiments of the present inventive concepts.

Referring to FIG. 8B, an information processing system 1300 may include a memory system 1310 having at least one of the semiconductor device 1 and semiconductor packages 90 and 95 according to exemplary embodiments. The information processing system 1300 includes a mobile device or a computer. For example, the information processing system 1300 may include a modem 1320, a central processing unit 1330, a RAM 1340, and a user interface 1350 which are electrically connected to a system bus 1360. The memory system 1310 may include a memory 1311 and a memory controller 1312 and have substantially the same configuration as that of the memory card 1200 in FIG. 8A. The memory system 1310 stores data processed by the central processing unit 1330 or data input from the outside. The information process system 1300 may be provided as a memory card, a semiconductor device disk, a camera image sensor, and other application chipsets. For example, the memory system 1310 may be realized as a solid state drive (SSD). In this case, the information processing system 1300 may stably store large data in the memory system 1310.

According to some exemplary embodiments, the insulation layer present on the bottom end of the through-via may be removed during the formation of the alignment key such that burden of the subsequent polishing process may be reduced. This approach may be operable to prevent or reduce damage and/or breakage of the though-via. As a result, yield and electrical characteristics of the resulting semiconductor devices may be improved. Additionally, the formation of the alignment key and removal of the mask layer may be performed in such a state in which the through-via is not exposed, which may prevent or reduce the contamination or particle caused by exposure of the through-via.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A method of forming a semiconductor device, comprising:
   providing a conductive via extending in a vertical direction through a substrate, a first end of the conductive via extending through a first surface of the substrate, so that the first end protrudes in the vertical direction relative to the first surface of the substrate;
   providing an insulating layer on the first end of the conductive via and on the first surface of the substrate;
   providing a mask layer on the insulating layer, and patterning the mask layer to form a mask layer pattern, the mask layer pattern having an opening at a side of the conductive via;
   removing an upper portion of the mask layer pattern so that a capping portion of the insulating layer that is on the first end of the conductive via is exposed; and
   removing a portion of the insulating layer at a side of, and spaced apart from, the conductive via, using the mask layer pattern as an etch mask, to form a recess in the insulating layer, and simultaneously removing the capping portion of the insulating layer on the first end of the conductive via.

2. The method of claim 1 further comprising, following removing the portion of the insulating layer at a side of, and spaced apart from, the conductive via, using the mask layer pattern as an etch mask, to form a recess in the insulating layer, and simultaneously removing the capping portion of the insulating layer:
   planarizing the first end of the conductive via.

3. The method of claim 2 wherein, planarizing the first end of the conductive via further results in upper corner portions of the recess in the insulating layer have a rounded cross-sectional profile.

4. The method of claim 1 further comprising, prior to removing the portion of the insulating layer at a side of, and spaced apart from, the conductive via, using the mask layer pattern as an etch mask, and simultaneously removing the capping portion of the insulating layer:
    removing at least an upper portion of the mask layer pattern.

5. The method of claim 1, further comprising, following removing the portion of the insulating layer at a side of, and spaced apart from, the conductive via, using the mask layer pattern as an etch mask, and simultaneously removing the capping portion of the insulating layer:
    removing the mask layer pattern.

6. The method of claim 1 wherein forming the insulating layer comprises:
    forming a lower insulating layer on the first end of the conductive via and on the first surface of the substrate; and
    forming an upper insulating layer on the lower insulating layer, the upper insulating layer having etch selectivity with respect to the lower insulating layer;
    wherein removing a portion of the insulating layer comprises removing at least a portion of the upper insulating layer to form the recess in the upper insulating layer.

7. The method of claim 6 wherein removing a portion of the insulating layer further comprises removing at least a portion of the lower insulating layer to further form the recess in the lower insulating layer.

8. The method of claim 1 wherein providing a mask layer on the insulating layer, comprises providing a first portion of the mask layer to a first depth on the first surface of the substrate and providing a second portion of the mask layer to a second depth on the first end of the conductive via and wherein the first depth is greater than the second depth.

9. The method of claim 8 wherein the first portion of the mask layer has an upper surface that is at a first height relative to the first surface of the substrate and wherein the insulating layer on the first end of the conductive via has an upper surface that is at a second height relative to the first surface of the substrate, and wherein the first height is less than the second height.

10. The method of claim 1 further comprising further removing an upper portion of that mask layer pattern to form a recessed mask layer pattern, and removing a portion of the insulating layer at a side of, and spaced apart from, the conductive via, using the recessed mask layer pattern as an etch mask.

11. A method of forming a semiconductor device, comprising:
    providing a conductive via extending in a vertical direction through a substrate, a first end of the conductive via extending through a first surface of the substrate, so that the first end projects in a vertical direction relative to the first surface of the substrate;
    providing an insulating layer on the first end of the conductive via and on the first surface of the substrate;
    providing a mask layer on the insulating layer, and patterning the mask layer to form a mask layer pattern, the mask layer pattern having an opening at a side of the conductive via;
    removing an upper portion of the mask layer pattern so that a capping portion of the insulating layer that is on the first end of the conductive via is exposed; and
    removing a portion of the insulating layer at a side of, and spaced apart from, the conductive via, using the mask layer pattern as an etch mask, to form an alignment key opening in the insulating layer; and
    following forming the alignment key opening, planarizing the first end of the conductive via.

12. The method of claim 11 wherein removing the portion of the insulating layer at a side of, and spaced apart from, the conductive via, using the mask layer pattern as an etch mask, to form an alignment key opening in the insulating layer, is performed simultaneous with removing the capping portion of the insulating layer on the first end of the conductive via.

13. A method for fabricating a semiconductor device, the method comprising:
    forming a through-via that penetrates a substrate, the through-via including a bottom end that protrudes outward from a bottom surface of the substrate;
    forming a lower insulation layer on the bottom surface of the substrate;
    patterning the lower insulation layer to remove a capping part thereof that covers the bottom end of the through-via such that the lower insulation layer remains along sidewalls of the through-via extending to the bottom end of the through-via;
    forming an alignment key that is defined at a recessed portion of the lower insulation layer simultaneously with the removal of the capping part;
    planarizing the bottom surface of the substrate to expose the bottom end of the through-via, and
    after forming the lower insulation layer, further comprising:
    forming a mask layer on the lower insulation layer;
    patterning the mask layer to form an opening configured to expose a portion of the lower insulation layer, the exposed portion of the lower insulation layer being defined as the alignment key; and
    recessing the mask layer to expose the capping part of the lower insulation layer,
    wherein the patterning of the lower insulation layer is performed by an etching process that uses the recessed mask layer as an etching mask.

14. The method of claim 13, wherein planarizing the bottom surface of the substrate comprises polishing the bottom end of the through-via and an extension of the lower insulation layer that covers a sidewall of the bottom end,
    wherein a corner of the alignment key becomes rounded by the polishing of the lower insulation layer.

* * * * *